(12) United States Patent
Choi et al.

(10) Patent No.: US 10,355,000 B2
(45) Date of Patent: Jul. 16, 2019

(54) METHOD OF FABRICATING SEMICONDUCTOR DEVICE

(71) Applicant: Samsung Electronics Co., Ltd., Suwon-si (KR)

(72) Inventors: Kyungin Choi, Seoul (KR); Taehyeon Kim, Hwaseong-si (KR); Hongshik Shin, Hwaseong-si (KR); Taegon Kim, Seoul (KR); Jaeyoung Park, Yongin-si (KR); Yuichiro Sasaki, Seoul (KR)

(73) Assignee: SAMSUNG ELECTRONICS CO., LTD., Yeongtong-gu, Suwon-si, Gyeonggi-do (KR)

( * ) Notice: Subject to any disclaimer, the term of this patent is extended or adjusted under 35 U.S.C. 154(b) by 0 days.

(21) Appl. No.: 15/793,442

(22) Filed: Oct. 25, 2017

(65) Prior Publication Data
US 2018/0286861 A1 Oct. 4, 2018

(30) Foreign Application Priority Data
Apr. 3, 2017 (KR) ........................ 10-2017-0043122

(51) Int. Cl.
| H01L 27/092 | (2006.01) |
|---|---|
| H01L 21/82 | (2006.01) |
| H01L 21/768 | (2006.01) |
| H01L 21/225 | (2006.01) |
| H01L 21/8238 | (2006.01) |
| H01L 29/66 | (2006.01) |
| H01L 29/78 | (2006.01) |

(Continued)

(52) U.S. Cl.
CPC ...... *H01L 27/0922* (2013.01); *H01L 21/2253* (2013.01); *H01L 21/76841* (2013.01); *H01L 21/823814* (2013.01); *H01L 27/092* (2013.01); *H01L 29/66545* (2013.01); *H01L 29/785* (2013.01); *H01L 29/7848* (2013.01); *H01L 29/161* (2013.01); *H01L 29/165* (2013.01); *H01L 29/665* (2013.01)

(58) Field of Classification Search
CPC ..... H01L 21/823418; H01L 21/823814; H01L 29/7848; H01L 29/0843; H01L 29/41725; H01L 29/41783; H01L 29/41791; H01L 21/67859; H01L 27/0924; H01L 27/0922; H01L 21/823821
See application file for complete search history.

(56) References Cited

U.S. PATENT DOCUMENTS

| 7,749,890 B2 | 7/2010 | Wong et al. |
|---|---|---|
| 9,484,251 B1 | 11/2016 | Besser et al. |
| 9,548,306 B2 | 1/2017 | Basker et al. |

(Continued)

*Primary Examiner* — Thanhha S Pham
(74) *Attorney, Agent, or Firm* — Muir Patent Law, PLLC

(57) ABSTRACT

A method of fabricating a semiconductor device includes pattering an upper portion of a substrate to form a first active pattern, the substrate including a semiconductor element having a first lattice constant, performing a selective epitaxial growth process on an upper portion of the first active pattern to form a first source/drain region, doping the first source/drain region with gallium, performing an annealing process on the first source/drain region doped with gallium, and forming a first contact pattern coupled to the first source/drain region. The first source/drain region includes a semiconductor element having a second lattice constant larger than the first lattice constant.

8 Claims, 46 Drawing Sheets

(51) Int. Cl.
*H01L 29/161* (2006.01)
*H01L 29/165* (2006.01)

(56) References Cited

U.S. PATENT DOCUMENTS

| | | |
|---|---|---|
| 2008/0116494 A1 | 5/2008 | Goldbach et al. |
| 2016/0027918 A1* | 1/2016 | Kim .................. H01L 29/7848 |
| | | 257/401 |
| 2016/0099342 A1* | 4/2016 | Basker ............... H01L 27/0924 |
| | | 438/283 |
| 2016/0211342 A1 | 7/2016 | Chen et al. |
| 2016/0233164 A1 | 8/2016 | Choi et al. |
| 2017/0213889 A1* | 7/2017 | Gluschenkov ...... H01L 29/0847 |
| 2017/0352762 A1* | 12/2017 | Yang ................. H01L 21/31111 |

* cited by examiner

METHOD OF FABRICATING SEMICONDUCTOR DEVICE

CROSS-REFERENCE TO RELATED APPLICATIONS

This U.S. non-provisional patent application claims priority under 35 U.S.C. § 119 to Korean Patent Application No. 10-2017-0043122, filed on Apr. 3, 2017, in the Korean Intellectual Property Office, the entire contents of which are hereby incorporated by reference.

BACKGROUND OF THE INVENTION

The present disclosure relates to a method of fabricating a semiconductor device, and in particular, to a method of fabricating a semiconductor device including a field effect transistor.

Due to their small-sized, multifunctional, and/or low-cost characteristics, semiconductor devices are being esteemed as important elements in the electronic industry. The semiconductor devices may be classified into a memory device for storing data, a logic device for processing data, and a hybrid device including both of memory and logic elements. To meet the increased demand for electronic devices with fast speed and/or low power consumption, it is important to realize semiconductor devices with high reliability, high performance, and/or multiple functions. To satisfy these technical criteria, complexity and/or integration density of semiconductor devices are being increased.

SUMMARY

Some embodiments of the present disclosure provide a method of fabricating a semiconductor device, in which a field effect transistor with improved electric characteristics is provided.

According to some embodiments of the present disclosure, a method of fabricating a semiconductor device may include pattering an upper portion of a substrate to form a first active pattern, the substrate including a semiconductor element having a first lattice constant, performing a selective epitaxial growth process on an upper portion of the first active pattern to form a first source/drain region, doping the first source/drain region with gallium, performing an annealing process on the first source/drain region doped with gallium, and forming a first contact pattern coupled to the first source/drain region. The first source/drain region may include a semiconductor element having a second lattice constant larger than the first lattice constant.

According to some embodiments of the present disclosure, a method of fabricating a semiconductor device may include forming a first device isolation layer on a PMOSFET region of a substrate to define a first active pattern, an upper portion of the first active pattern vertically protruding above the device isolation layer, forming a gate electrode to cross the first active pattern, performing a selective epitaxial growth process on the first active pattern adjacent to a side of the gate electrode to form a first source/drain region, doping the first source/drain region with gallium, performing an annealing process on the first source/drain region doped with gallium, and forming a first contact pattern coupled to the first source/drain region.

According to some embodiments of the present disclosure, a semiconductor device may include a first active pattern on a PMOSFET region of a substrate, the substrate including a semiconductor element having a first lattice constant, a gate electrode crossing the first active pattern and extending in a first direction, a first source/drain region provided in the first active pattern at a side of the gate electrode, and a first contact pattern coupled to the first source/drain region. The first source/drain region may include a semiconductor element having a second lattice constant larger than the first lattice constant, an upper portion of the first source/drain region may include gallium (Ga) as an impurity, and a concentration of gallium in the first source/drain region may decrease in a direction from the contact pattern toward a lower portion of the first source/drain region.

BRIEF DESCRIPTION OF THE DRAWINGS

Example embodiments will be more clearly understood from the following brief description taken in conjunction with the accompanying drawings. The accompanying drawings represent non-limiting, example embodiments as described herein.

DETAILED DESCRIPTION

The present disclosure now will be described more fully hereinafter with reference to the accompanying drawings, in which various exemplary embodiments are shown. The invention may, however, be embodied in many different forms and should not be construed as limited to the exemplary embodiments set forth herein.

It should be noted that the accompanying drawings are intended to illustrate the general characteristics of methods, structure and/or materials utilized in certain example embodiments and to supplement the written description provided below. These drawings are not, however, to scale and may not precisely reflect the precise structural or performance characteristics of any given embodiment, and should not be interpreted as limiting the range of values or properties encompassed by example embodiments. For example, the relative thicknesses and positioning of molecules, layers, regions and/or structural elements may be reduced or exaggerated for clarity. The use of similar or identical reference numbers in the various drawings is intended to indicate the presence of a similar or identical element or feature.

Ordinal numbers such as "first," "second," "third," etc. may be used simply as labels of certain elements, steps, etc., to distinguish such elements, steps, etc. from one another. Terms that are not described using "first," "second," etc., in the specification, may still be referred to as "first" or "second" in a claim. In addition, a term that is referenced with a particular ordinal number (e.g., "first" in a particular claim) may be described elsewhere with a different ordinal number (e.g., "second" in the specification or another claim).

Spatially relative terms, such as "beneath," "below," "lower," "above," "upper" and the like, may be used herein for ease of description to describe positional relationships, such as illustrated in the figures, for example. It will be understood that the spatially relative terms encompass different orientations of the device in addition to the orientation depicted in the figures.

Terms such as "same," "equal," "planar," or "coplanar," as used herein encompass identicality and near identicality including variations that may occur, for example, due to manufacturing processes. The term "substantially" may be used herein to emphasize this meaning, unless the context or other statements indicate otherwise.

Figure 1:
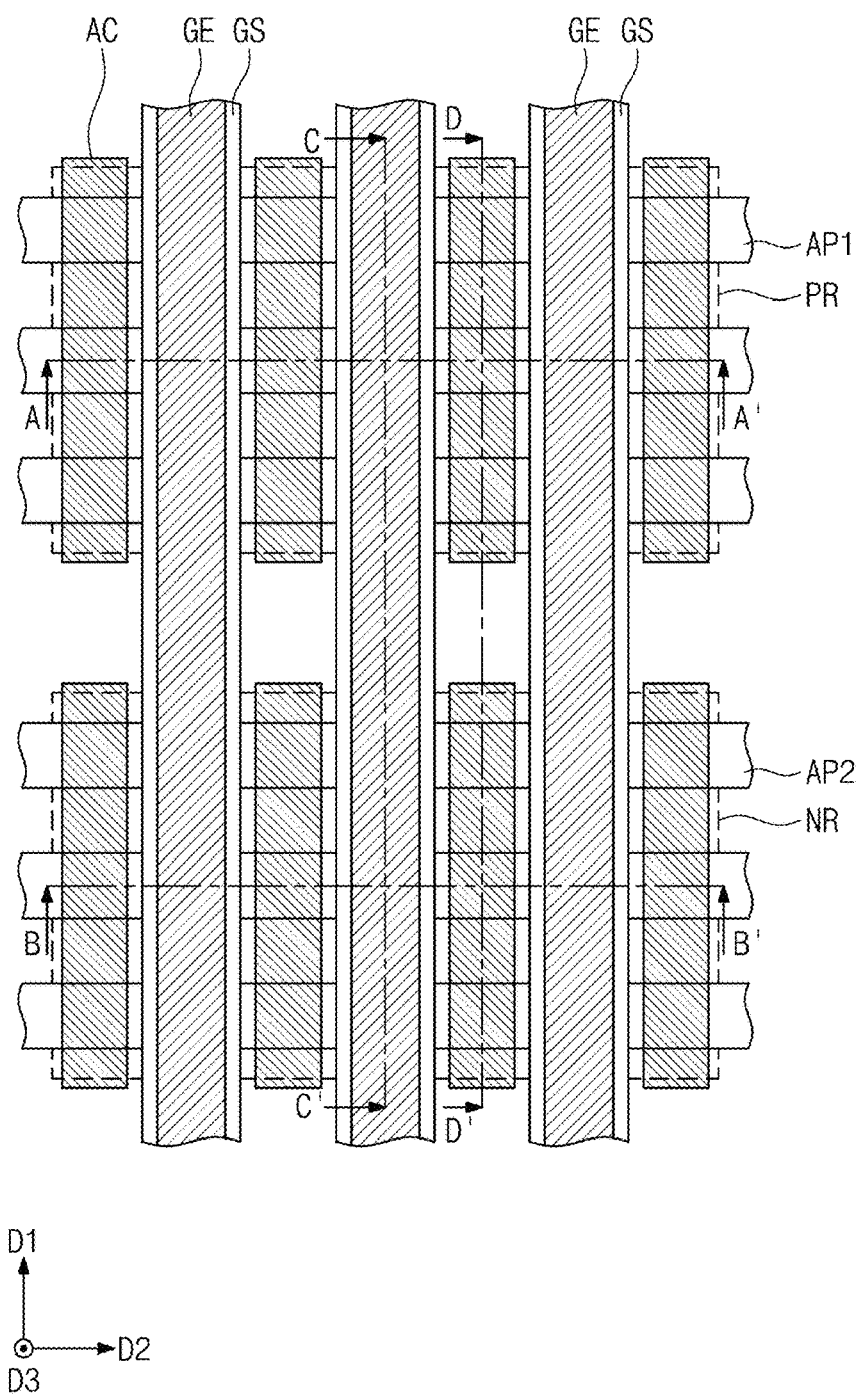
FIG. 1 is a plan view illustrating a semiconductor device according to some embodiments of the present disclosure.
Figure 2A:
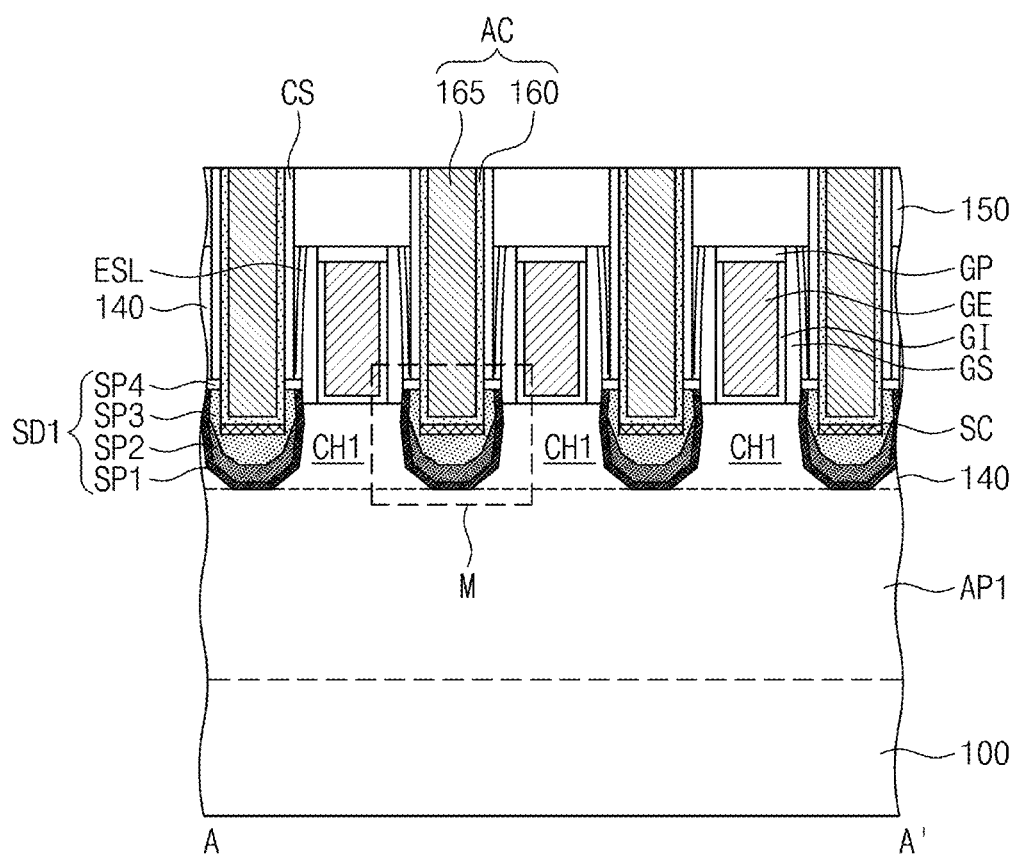
FIGS. 2A to 2D are cross-sectional views taken along lines A-A', B-B', C-C', and D-D', respectively, of FIG. 1.
Figure 2B:
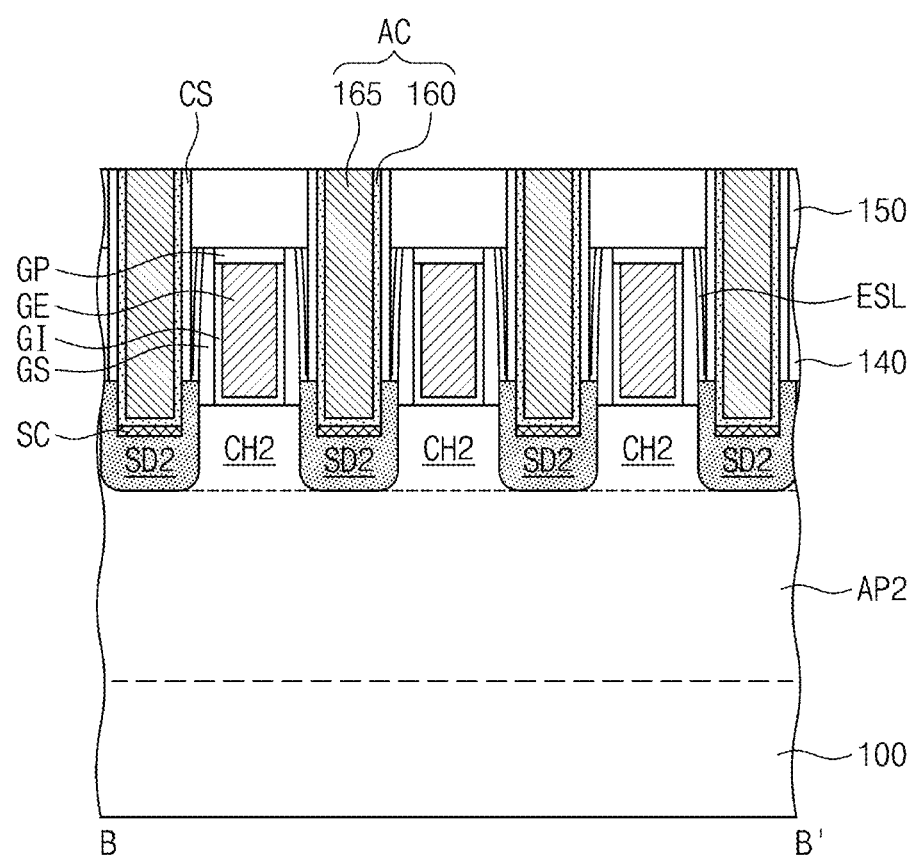
Figure 2C:
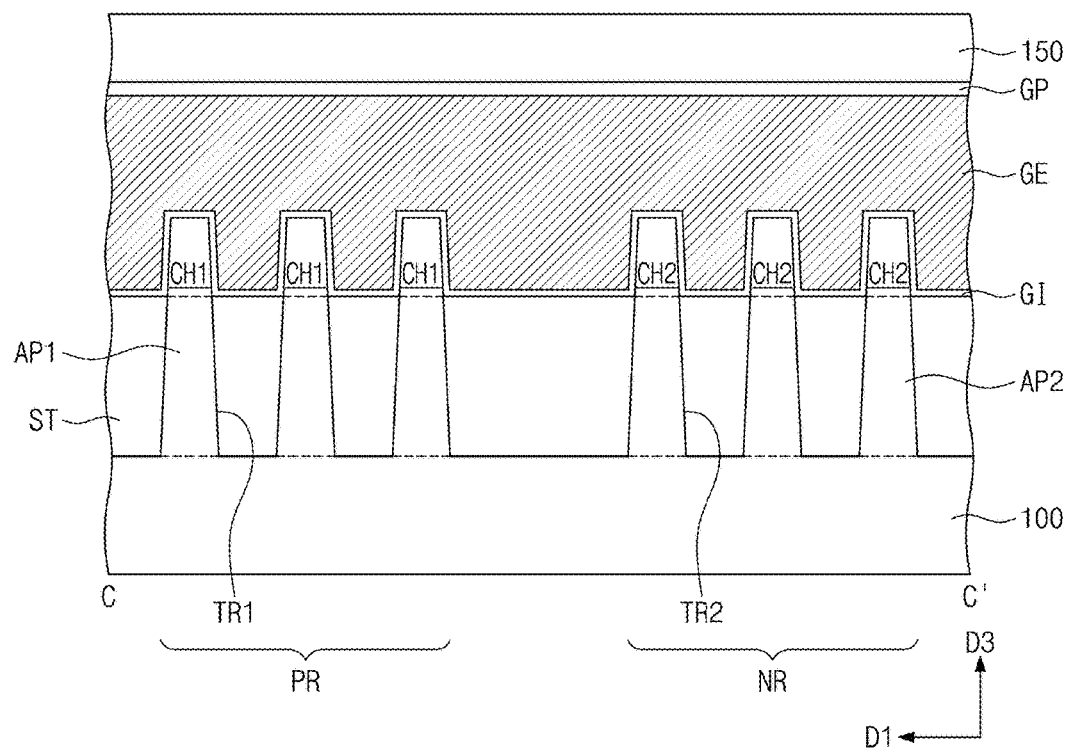
Figure 2D:
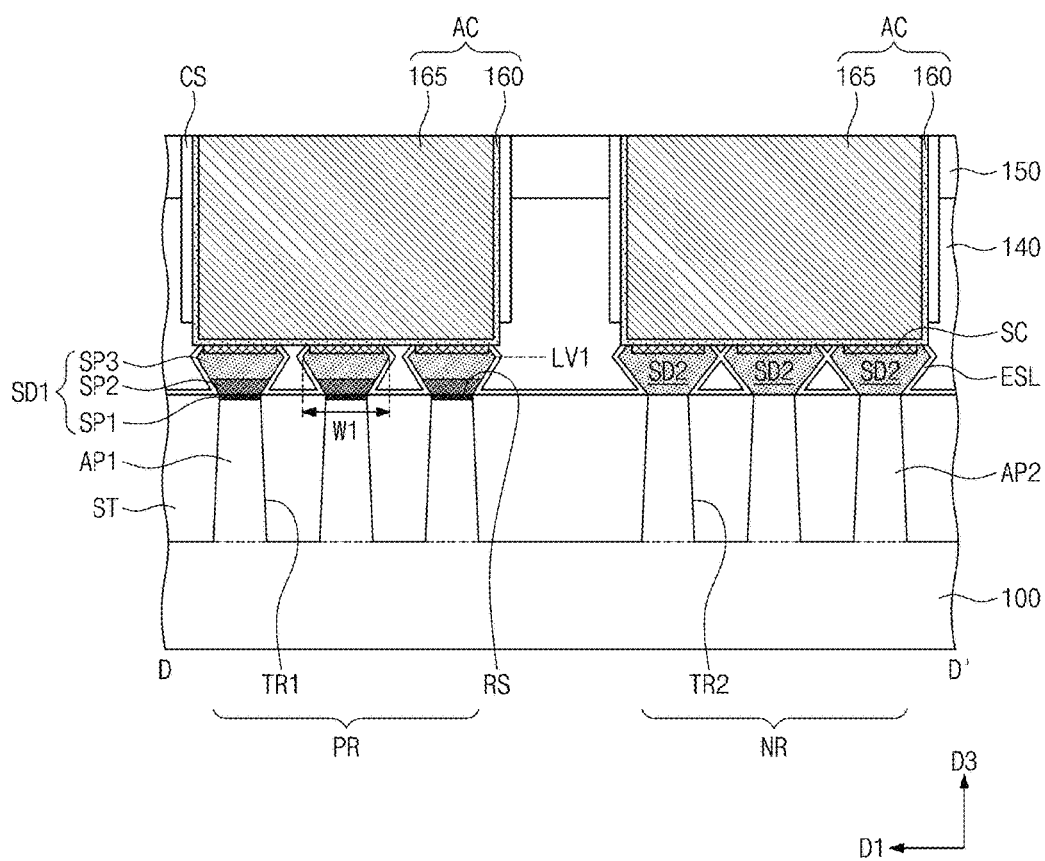
Figure 3:
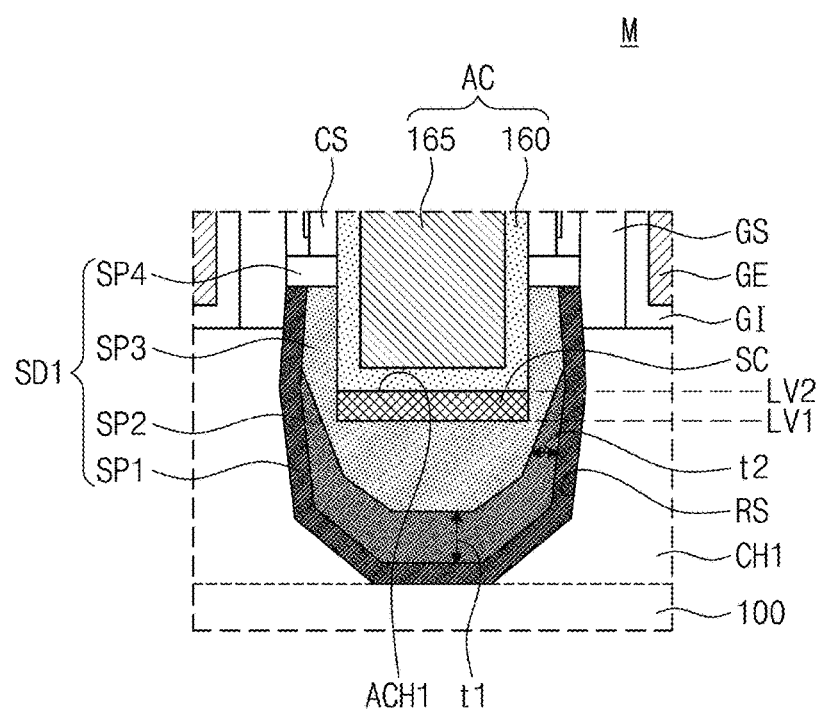
FIG. 3 is an enlarged cross-sectional view of a portion M of FIG. 2A.

FIG. 1 is a plan view illustrating a semiconductor device according to some embodiments of the present disclosure. FIGS. 2A to 2D are cross-sectional views taken along lines A-A', B-B', C-C', and D-D', respectively, of FIG. 1. FIG. 3 is an enlarged cross-sectional view of a portion M of FIG. 2A.

As used herein, a semiconductor device may refer to a device such as a semiconductor chip (e.g., memory chip and/or logic chip formed on a die), a stack of semiconductor chips, a semiconductor package including one or more semiconductor chips stacked on a package substrate, or a package-on-package device including a plurality of packages. These devices may be formed using ball grid arrays, wire bonding, through substrate vias, or other electrical connection elements, and may include memory devices such as volatile or non-volatile memory devices.

Referring to FIGS. 1, 2A to 2D, and 3, a device isolation layer ST may be provided in an upper portion of a substrate 100. The device isolation layer ST may include a PMOSFET region PR and an NMOSFET region NR. The substrate 100 may be or include a semiconductor wafer, which is made of at least one of silicon, germanium, silicon-germanium, or a semiconductor compound. As an example, the substrate 100 may be a silicon wafer. The device isolation layer ST may be formed of or include an insulating material (e.g., silicon oxide). In some embodiments, the substrate 100 may include only silicon.

The PMOSFET region PR and the NMOSFET region NR may be spaced apart from each other in a first direction D1 parallel to a top surface of the substrate 100, and the device isolation layer ST may be interposed between the PMOSFET and NMOSFET regions PR and NR. The PMOSFET region PR and the NMOSFET region NR may extend in a second direction D2 crossing the first direction D1.

Although not shown, a bottom level of the device isolation layer ST between the PMOSFET and NMOSFET regions PR and NR may be deeper in a downward direction perpendicular to the top surface of the substrate 100 than a bottom level of the device isolation layer ST between adjacent active patterns AP1 and/or between adjacent active patterns AP2.

The PMOSFET and NMOSFET regions PR and NR may be logic cell regions, on which logic transistors for a logic circuit of a semiconductor device will be formed. As an example, logic transistors constituting a processor core or I/O terminals may be provided on the logic cell region of the substrate 100. Some of the logic transistors may be provided on the PMOSFET and NMOSFET regions PR and NR.

In certain embodiments, the PMOSFET and NMOSFET regions PR and NR may be memory cell regions, on which memory cell transistors for storing data are provided. For example, memory cell transistors constituting a plurality of static random access memory (SRAM) cells may be provided on the memory cell region of the substrate 100. Some of the memory cell transistors may be provided on the PMOSFET and NMOSFET regions PR and NR. But the present disclosure is not limited thereto.

A plurality of active patterns AP1 and AP2 extending in the second direction D2 may be provided on the PMOSFET region PR and the NMOSFET region NR. The active patterns AP1 and AP2 may include first active patterns AP1 on the PMOSFET region PR and second active patterns AP2 on the NMOSFET region NR. The first and second active patterns AP1 and AP2 may be portions of the substrate 100 and may have a protruding shape protruding in an upward direction perpendicular to the top surface of the substrate 100. The first and second active patterns AP1 and AP2 may be arranged spaced apart from each other in the first direction D1.

Each adjacent pair of the first active patterns AP1 may be provided to define a first trench TR1, and each adjacent pair of the second active patterns AP2 may be provided to define a second trench TR2. A corresponding device isolation layer ST may be provided to fill each of the first trench TR1 and the second trench TR2. For example, shapes of the first and second active patterns AP1 and AP2 may be defined by the corresponding device isolation layer ST. The device isolation layers ST may cover lower side surfaces of each of the first and second active patterns AP1 and AP2. As shown in the drawings, three first active patterns AP1 may be provided on the PMOSFET region PR and three second active patterns AP2 may be provided on the NMOSFET region NR is illustrated, but the disclosure is not limited thereto.

The first and second active patterns AP1 and AP2 may include upper portions that are located at a higher level in a direction perpendicular to the top surface of the substrate 100 than that of top surfaces of the device isolation layers ST. The upper portions of the first and second active patterns AP1 and AP2 may have a structure vertically protruding above top surfaces of the device isolation layers ST. Each of the upper portions of the first and second active patterns AP1 and AP2 may have a protruding fin shape between each pair of the device isolation layers ST.

First channel regions CH1 and first source/drain regions SD1 may be provided in upper portions of the first active patterns AP1. The first source/drain regions SD1 may be p-type doped regions. Each of the first channel regions CH1 may be interposed between a pair of the first source/drain regions SD1. Second channel regions CH2 and second source/drain regions SD2 may be provided in upper portions of the second active patterns AP2. The second source/drain regions SD2 may be n-type doped regions. Each of the second channel regions CH2 may be interposed between a pair of the second source/drain regions SD2.

The first and second source/drain regions SD1 and SD2 may be epitaxial patterns that are formed by a selective epitaxial growth process. The first and second source/drain regions SD1 and SD2 may have top surfaces that are positioned at a higher level than those of the first and second channel regions CH1 and CH2. The first and second source/drain regions SD1 and SD2 may include a semiconductor element that is different from the substrate 100. As an example, the first source/drain regions SD1 may include a semiconductor material having a lattice constant greater than that of the substrate 100. Thus, according to an exemplary embodiment, the first source/drain regions SD1 may exert a compressive stress to the first channel regions CH1. As an example, the second source/drain regions SD2 may include a semiconductor material having a lattice constant equal to or less than that of the substrate 100. Thus, according to an exemplary embodiment, the second source/drain regions SD2 may exert a tensile stress to the second channel regions CH2. As an example, the second source/drain regions SD2 may include the same semiconductor element (e.g., silicon) as that of the substrate 100.

Gate electrodes GE may be provided to cross the first and second active patterns AP1 and AP2 and to extend in the first direction D1. The gate electrodes GE may be spaced apart from each other in the second direction D2. Each of the gate electrodes GE may be overlapped with the first and second channel regions CH1 and CH2, when viewed in a plan view. Each of the gate electrodes GE may be provided to enclose top and two opposing side surfaces of each of the first and second channel regions CH1 and CH2 (e.g., see FIG. 2C). As an example, the gate electrodes GE may be formed of or include at least one of conductive metal nitrides (e.g., titanium nitride or tantalum nitride) or metals (e.g., titanium, tantalum, tungsten, copper, or aluminum).

A pair of gate spacers GS may be respectively provided on opposite side surfaces of each of the gate electrodes GE. The gate spacers GS may extend along the gate electrodes GE and in the first direction D1. Top surfaces of the gate spacers GS may be higher than those of the gate electrodes GE. The top surfaces of the gate spacers GS may be coplanar with that of a first interlayered insulating layer 140 to be described below. The gate spacers GS may include at least one of SiCN, SiCON, or SiN, for example. In certain embodiments, the gate spacers GS may be a multi-layered structure including at least two of SiCN, SiCON, or SiN.

Gate dielectric patterns GI may be interposed between the gate electrodes GE and the first and second active patterns AP1 and AP2. Each of the gate dielectric patterns GI may extend along a bottom surface of each of the gate electrodes GE such that the lowermost surface of each of the gate electrodes GE may be provided at a level higher than the lower most surface of the gate dielectric patterns in a direction perpendicular to a top surface of the substrate 100. Each of the gate dielectric patterns GI may be provided to cover top and two side surfaces of each of the first and second channel regions CH1 and CH2. The gate dielectric patterns GI may be formed of or include at least one of high-k dielectric materials. As an example, the high-k dielectric material may be formed of or include at least one of hafnium oxide, hafnium silicon oxide, lanthanum oxide, zirconium oxide, zirconium silicon oxide, tantalum oxide, titanium oxide, barium strontium titanium oxide, barium titanium oxide, strontium titanium oxide, lithium oxide, aluminum oxide, lead scandium tantalum oxide, or lead zinc niobate.

A gate capping pattern GP may be provided on each of the gate electrodes GE. The gate capping patterns GP may extend along the gate electrodes GE or in the first direction D1. The gate capping patterns GP may be formed of or include a material, which is selected to have an etch selectivity with respect to first and second interlayered insulating layers 140 and 150 to be described below. For example, the gate capping patterns GP may be formed of or include at least one of SiON, SiCN, SiCON, or SiN.

The first interlayered insulating layer 140 may be provided on the substrate 100. The first interlayered insulating layer 140 may be provided to cover the gate spacers GS and the first and second source/drain regions SD1 and SD2. The first interlayered insulating layer 140 may have a top surface that is substantially coplanar with those of the gate capping patterns GP and the gate spacers GS. An etch stop layer ESL may be interposed between the gate spacers GS and the first interlayered insulating layer 140. The second interlayered insulating layer 150 may be formed on the first interlayered insulating layer 140 to cover the gate capping patterns GP. As an example, the first and second interlayered insulating layers 140 and 150 may be formed of or include a silicon oxide layer. The etch stop layer ESL may be formed of or include a silicon nitride layer.

In addition, at least one contact pattern AC, which penetrates the first and second interlayered insulating layers 140 and 150 and is electrically connected to the first and second source/drain regions SD1 and SD2, may be provided between a pair of the gate electrodes GE. As an example, each of the contact patterns AC may be connected to a plurality of source/drain regions SD1 and SD2. As another example, although not shown, at least one contact pattern AC may be connected to one the source/drain regions SD1 and SD2, but the present disclosure is not limited thereto.

Each of the contact patterns AC may include a conductive pillar 165 and a barrier layer 160, which is provided to enclose the conductive pillar 165. The barrier layer 160 may be provided to cover side and bottom surfaces of the conductive pillar 165. The conductive pillar 165 may include at least one of metallic materials (e.g., aluminum, copper, tungsten, molybdenum, and cobalt). The barrier layer 160 may include a metal layer and a metal nitride layer. The metal layer may include at least one of titanium, tantalum, tungsten, nickel, cobalt, or platinum. The metal nitride layer may include at least one of titanium nitride (TiN), tantalum nitride (TaN), tungsten nitride (WN), nickel nitride (NiN), cobalt nitride (CoN), or platinum nitride (PtN).

Metal silicide layers SC may be interposed between the first and second source/drain regions SD1 and SD2 and the contact patterns AC. The contact patterns AC may be electrically connected to the first and second source/drain regions SD1 and SD2 through the metal silicide layers SC. The metal silicide layers SC may be formed of or include at least one of metal silicides (e.g., titanium silicide, tantalum silicide, tungsten silicide, nickel silicide, or cobalt silicide).

Contact spacers CS may be interposed between the contact patterns AC and the first and second interlayered insulating layers 140 and 150. Each of the contact spacers CS may be provided to cover a side surface of each of the contact patterns AC. Top surfaces of the contact spacers CS may be substantially coplanar with a top surface of the second interlayered insulating layer 150 and top surfaces of the contact patterns AC. Bottom surfaces of the contact spacers CS may be higher than those of the contact patterns AC. As an example, the bottom surfaces of the contact spacers CS may contact top surfaces of the first and second source/drain regions SD1 and SD2.

The first source/drain regions SD1 will be described in more detail with reference to FIGS. 2A, 2D, and 3. The first source/drain regions SD1 may be provided to fill recess regions RS, which are formed in an upper portion of the first active pattern AP1. When measured in the first direction D1, the first source/drain region SD1 may have the maximum width W1, at a first level LV1 between the top surface of the first channel region CH1 and the bottom surface of the first source/drain region SD1.

Each of the first source/drain regions SD1 may include a first semiconductor pattern SP1, a second semiconductor pattern SP2, a third semiconductor pattern SP3, and a fourth semiconductor pattern SP4. The first semiconductor pattern SP1 may be provided to cover an inner side surface of the recess region RS. When viewed in the second direction D2, the first semiconductor pattern SP1 may have a 'U'-shaped vertical section. As an example, the first semiconductor pattern SP1 may be conformally formed to have a uniform thickness on the inner side surface of the recess region RS.

The second semiconductor pattern SP2 may be provided on the first semiconductor pattern SP1. The second semiconductor pattern SP2 may be provided to cover an inner side surface of the first semiconductor pattern SP1. When viewed in the second direction D2, the second semiconductor pattern SP2 may have a 'U'-shaped vertical section. A thickness of the second semiconductor pattern SP2 adjacent to a bottom of the recess region RS may be larger than that of the first semiconductor pattern SP1. In some embodiments, when viewed in the first direction D1, a thickness of the second semiconductor pattern SP2 gradually decreases from a bottom of the recess region RS to an upper portion of the recess region RS. For example, as illustrated in FIG. 3, a thickness t1 of the second semiconductor pattern SP2 adjacent to a bottom of the recess region RS may be larger than a thickness t2 of the semiconductor pattern SP2 adjacent to upper portion of the recess region RS.

The third semiconductor pattern SP3 may be provided on the second semiconductor pattern SP2. The third semiconductor pattern SP3 may be provided to fill the recess region RS. The third semiconductor pattern SP3 may have a larger volume than each of the first, second and fourth semiconductor patterns SP1, SP2, and SP4.

The fourth semiconductor pattern SP4 may be provided on the third semiconductor pattern SP3. The fourth semiconductor pattern SP4 may be provided to conformally cover an exposed surface of the third semiconductor pattern SP3.

Each of the first to third semiconductor patterns SP1, SP2, and SP3 may include a semiconductor material having a lattice constant greater than that of the substrate 100. For example, in some embodiments, the substrate 100 may include silicon (Si), and each of the first to third semiconductor patterns SP1, SP2, and SP3 may include silicon-germanium (SiGe). A lattice constant of germanium (Ge) may be larger than that of silicon (Si).

The first semiconductor pattern SP1 may be interposed between the substrate 100 and the second semiconductor pattern SP2 and may be used as a buffer layer. The first semiconductor pattern SP1 may contain a relatively low concentration of germanium (Ge), the third semiconductor pattern SP3 may contain a relatively high concentration of germanium (Ge), and the second semiconductor pattern SP2 may contain a concentration of germanium (Ge) between the concentration of germanium (Ge) of the first semiconductor pattern SP1 and the concentration of germanium (Ge) of the third semiconductor pattern SP3. As an example, a content (e.g., an atomic percentage or concentration) of germanium (Ge) in the first semiconductor pattern SP1 may range from 15 at % to 25 at %. A content (e.g., anatomic percentage or concentration) of germanium (Ge) in the second semiconductor pattern SP2 may be higher than that in the first semiconductor pattern SP1. As an example, the content (e.g., atomic percentage or concentration) of germanium (Ge) in the second semiconductor pattern SP2 may range from 25 at % to 50 at %. A content (e.g., atomic percentage or concentration) of germanium (Ge) in the third semiconductor pattern SP3 may be higher than that in the second semiconductor pattern SP2. As an example, the content (e.g., atomic percentage or concentration) of germanium (Ge) in the third semiconductor pattern SP3 may range from 50 at % to 75 at %.

The fourth semiconductor pattern SP4 may serve as a capping layer for protecting the third semiconductor pattern SP3. The fourth semiconductor pattern SP4 may include the same semiconductor element as that of the substrate 100. In some embodiments, the fourth semiconductor pattern SP4 may include a silicon pattern with a single crystalline structure. A content (e.g., atomic percentage or concentration) of silicon (Si) in the fourth semiconductor pattern SP4 may range from 95 at % to 100 at %.

A first contact hole ACH1 may be formed in the third semiconductor pattern SP3. A bottom of the first contact hole ACH1 may be positioned at a second level LV2. When measured in the third direction D3, the second level LV2 may be higher than the first level LV1. A metal silicide layer SC may be provided in the third semiconductor pattern SP3. The metal silicide layer SC may be positioned below the first contact hole ACH1.

The contact pattern AC may be provided in the first contact hole ACH1. A side surface of the contact pattern AC may contact an inner side surface of the third semiconductor pattern SP3. A bottom surface of the contact pattern AC may contact a top surface of the metal silicide layer SC. For example, a side surface of the barrier layer 160 of the contact pattern AC may contact an inner side surface of the third semiconductor pattern SP3 and a bottom surface of the barrier layer 160 of the contact pattern AC may contact a top surface of the metal silicide layer SC. The bottom surface of the contact pattern AC (e.g., the bottom surface of barrier layer 160) may be positioned at the second level LV2. The bottom surface of the contact pattern AC may be positioned at a lower level than that of the gate dielectric patterns GI. The bottom surface of the contact pattern AC may be positioned at a lower level than that of the top surface of the first channel regions CH1. The contact pattern AC may be spaced apart from the first and second semiconductor patterns SP1 and SP2.

The third semiconductor pattern SP3 may contain gallium (Ga) as impurities. A concentration of gallium (Ga) in the third semiconductor pattern SP3 may decrease in a direction from the contact pattern AC and the metal silicide layer SC toward the second semiconductor pattern SP2. In some embodiments, segregation of gallium (Ga) may occur due to the metal silicide layer SC, and a concentration of gallium (Ga) may increase in a direction toward the metal silicide layer SC. As an example, a concentration of gallium (Ga) in the third semiconductor pattern SP3 may range from 1.0 E20/cm$^3$ to 1.0 E22/cm$^3$.

In a silicon-germanium (SiGe) layer, gallium (Ga) may have relatively high solubility. As an example, in the silicon-germanium (SiGe), the solubility of gallium (Ga) may be higher than the solubility of boron (B). Furthermore, as described above, the segregation of gallium (Ga) may occur in the third semiconductor pattern SP3. In some embodiments, since the third semiconductor pattern SP3 in contact with the contact pattern AC contains a relatively high doping concentration of gallium (Ga), electric resistance between the contact pattern AC and the first source/drain region SD1 may be lowered.

According to conventional semiconductor device where the contact pattern AC is formed to have the bottom surface located below the first level LV1 (e.g., below a level where the source/drain region SD1 has a maximum width in the first direction D1), a volume of the first source/drain region SD1 may be reduced. This may lead to difficulty in applying a sufficiently large compressive stress to the first channel region CH1. By contrast, according to some embodiments of the present disclosure, since the bottom surface of the contact pattern AC is formed at the second level LV2 higher than the first level LV1 (e.g., higher than a level where the source/drain region SD1 has a maximum width in the first direction D1), it may be possible to apply a sufficiently large compressive stress to the first channel region CH1.

In some embodiments, the bottom surface of the contact pattern AC may be positioned adjacent to the first level LV1. Since the first source/drain region SD1 at the first level LV1 has the maximum width W1 (e.g., in the D1 direction), a contact area between the contact pattern AC and the first source/drain region SD1 may be relatively increased. Thus, electric resistance between the contact pattern AC and the first source/drain region SD1 may be reduced.

Figure 20:
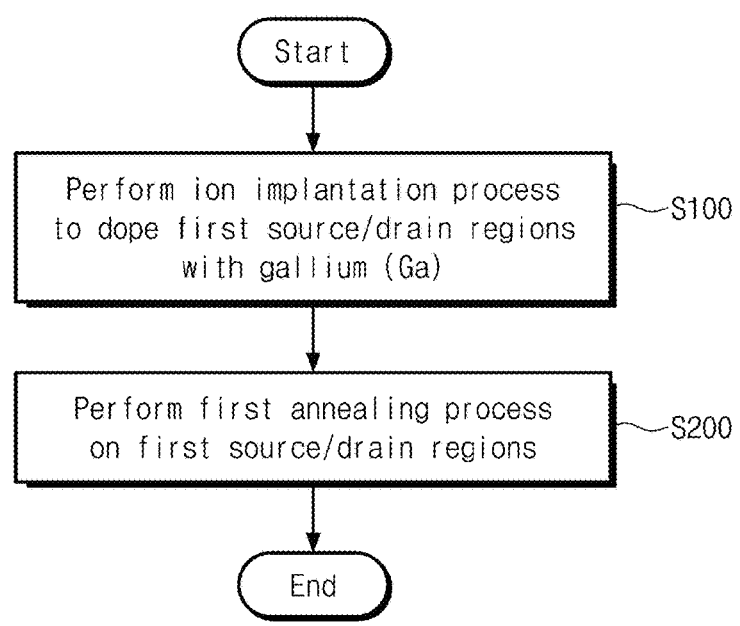
FIG. 20 is a flow chart of a gallium doping process according to some embodiments of the present disclosure.

FIGS. 4, 6, 8, 10, 12, 14, 16, and 18 are plan views illustrating a method of fabricating a semiconductor device, according to some embodiments of the present disclosure. FIGS. 5A, 7A, 9A, 11A, 13A, 15A, 17A, and 19A are cross-sectional views taken along lines A-A' of FIGS. 4, 6, 8, 10, 12, 14, 16, and 18, respectively. FIGS. 5B, 7B, 9B, 11B, 13B, 15B, 17B, and 19B are cross-sectional views taken along lines B-B' of FIGS. 4, 6, 8, 10, 12, 14, 16, and 18, respectively. FIGS. 7C, 9C, 11C, 13C, 15C, 17C, and 19C are cross-sectional views taken along lines C-C' of FIGS. 6, 8, 10, 12, 14, 16, and 18, respectively. FIGS. 9D, 11D, 13D, 15D, 17D, and 19D are cross-sectional views taken along lines C-C' of FIGS. 8, 10, 12, 14, 16, and 18, respectively. FIG. 20 is a flow chart of a gallium doping process according to some embodiments of the present disclosure.

Figure 4:
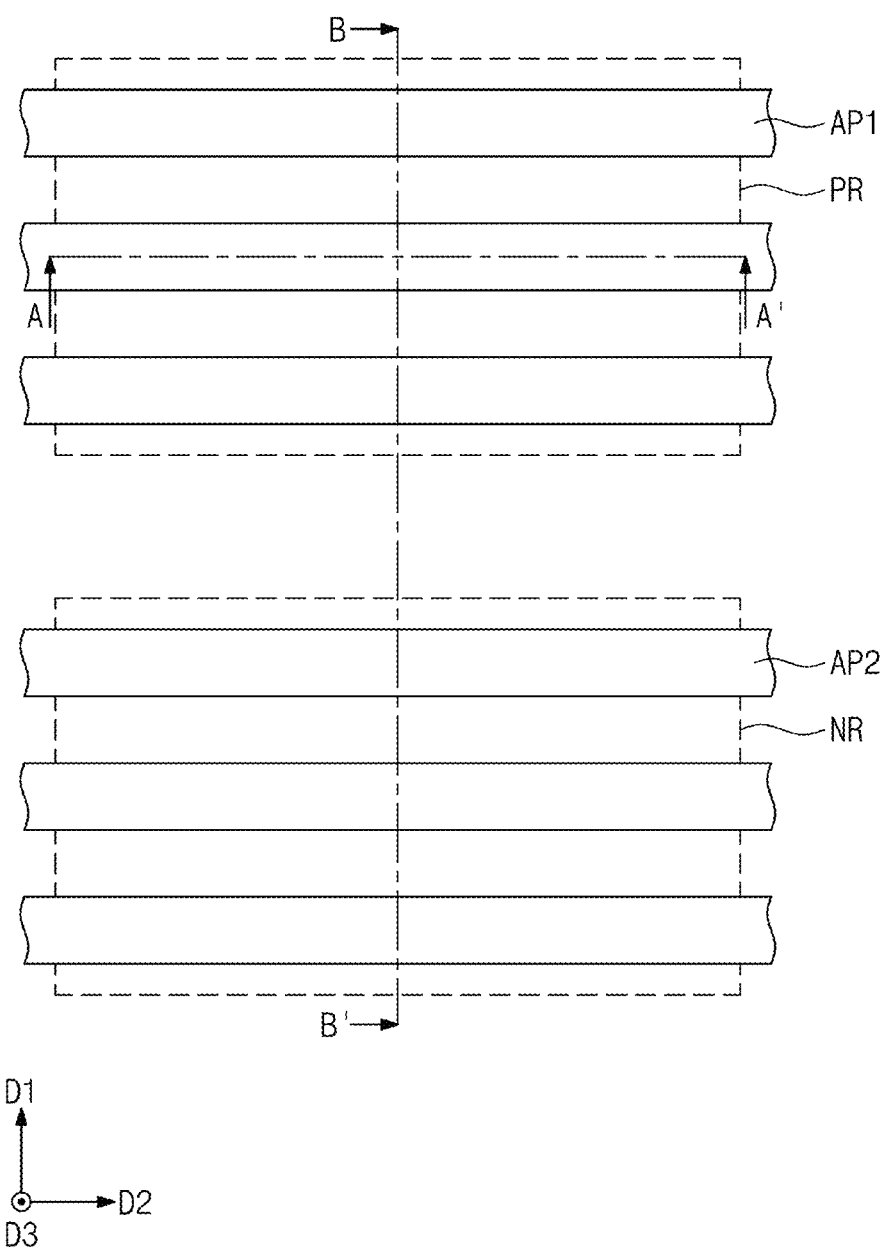
FIGS. 4, 6, 8, 10, 12, 14, 16, and 18 are plan views illustrating a method of fabricating a semiconductor device, according to some embodiments of the present disclosure.
Figure 5A:
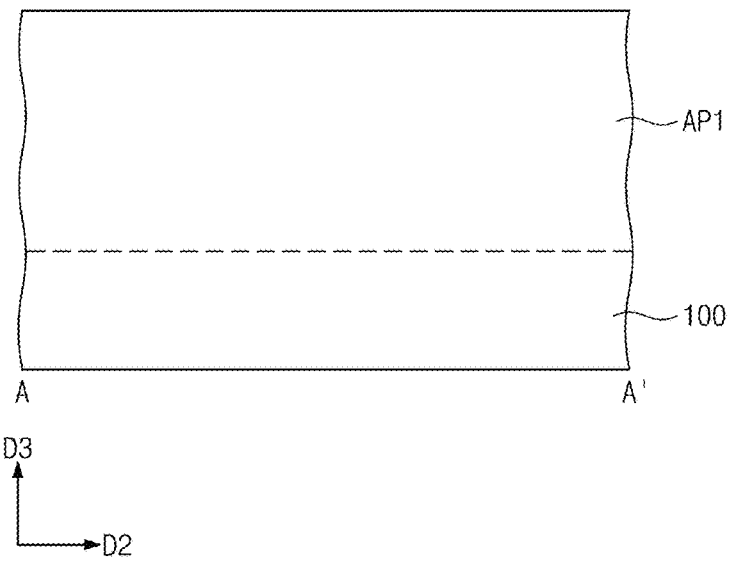
FIGS. 5A, 7A, 9A, 11A, 13A, 15A, 17A, and 19A are cross-sectional views taken along lines A-A' of FIGS. 4, 6, 8, 10, 12, 14, 16, and 18, respectively.
Figure 5B:
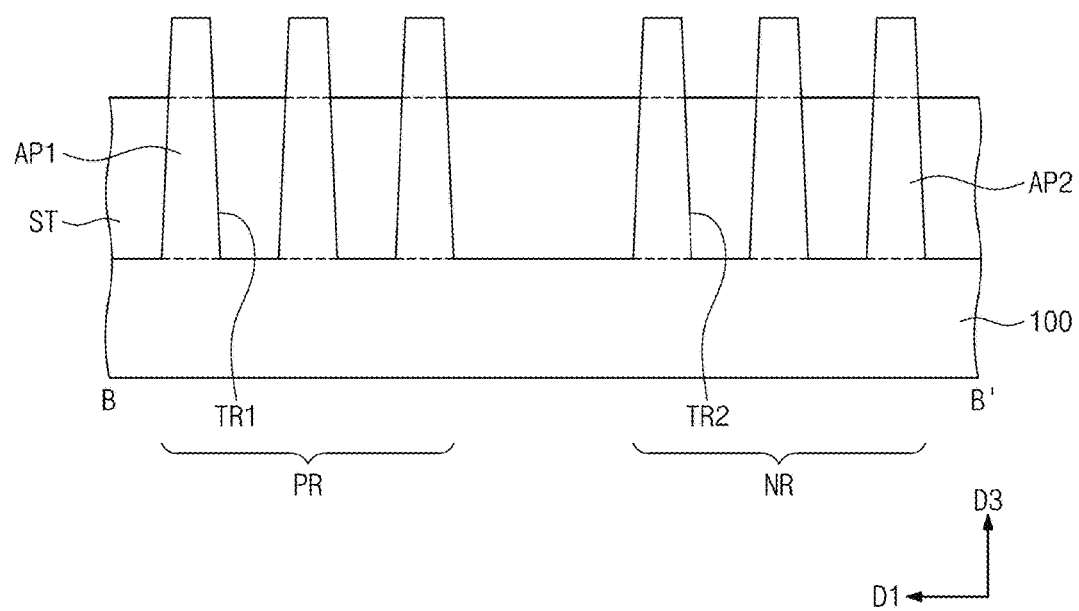
FIGS. 5B, 7B, 9B, 11B, 13B, 15B, 17B, and 19B are cross-sectional views taken along lines B-B' of FIGS. 4, 6, 8, 10, 12, 14, 16, and 18, respectively.
Figure 6:
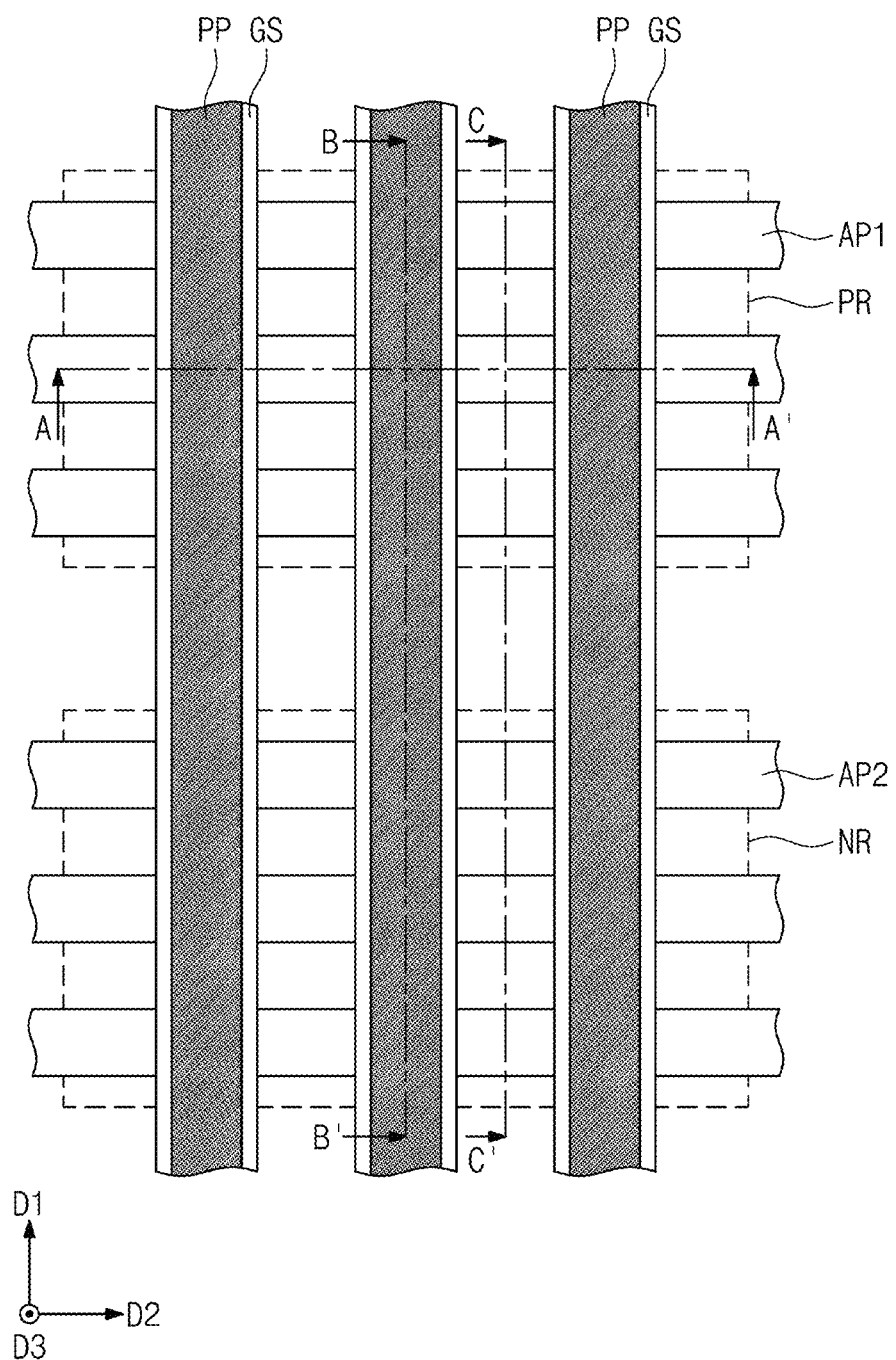
Figure 7A:
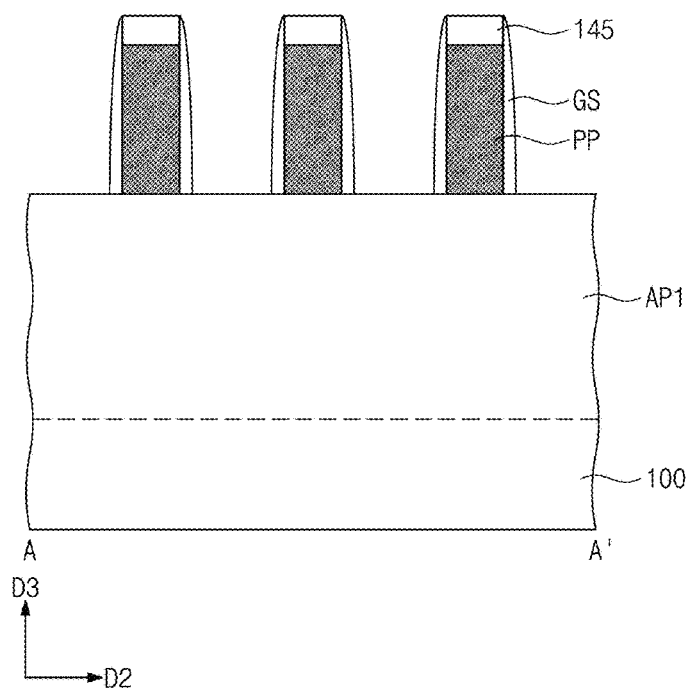
Figure 7B:
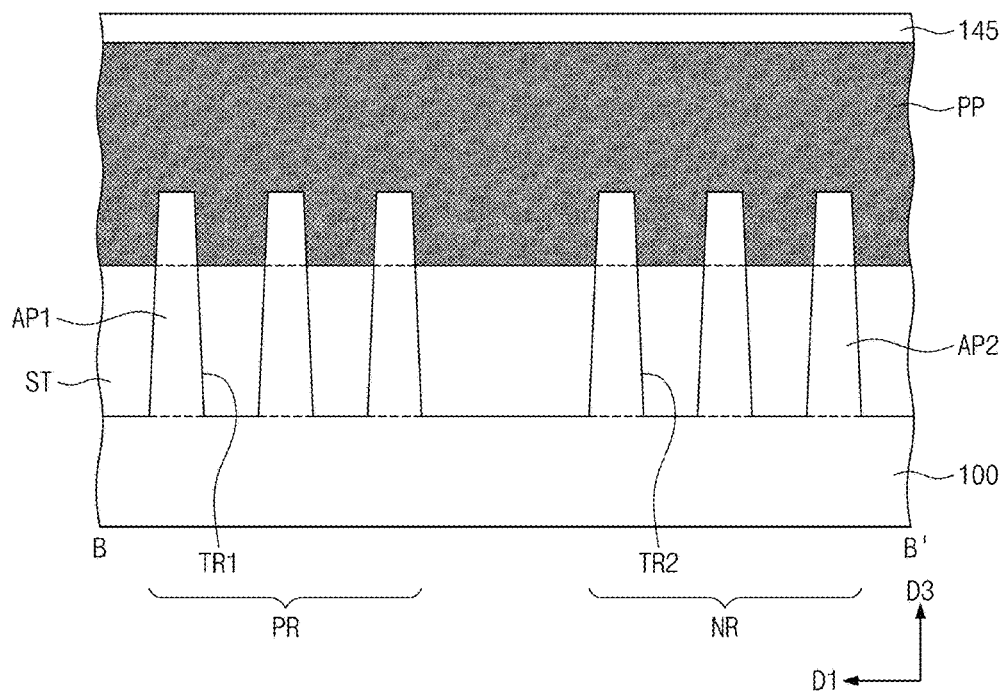
Figure 7C:
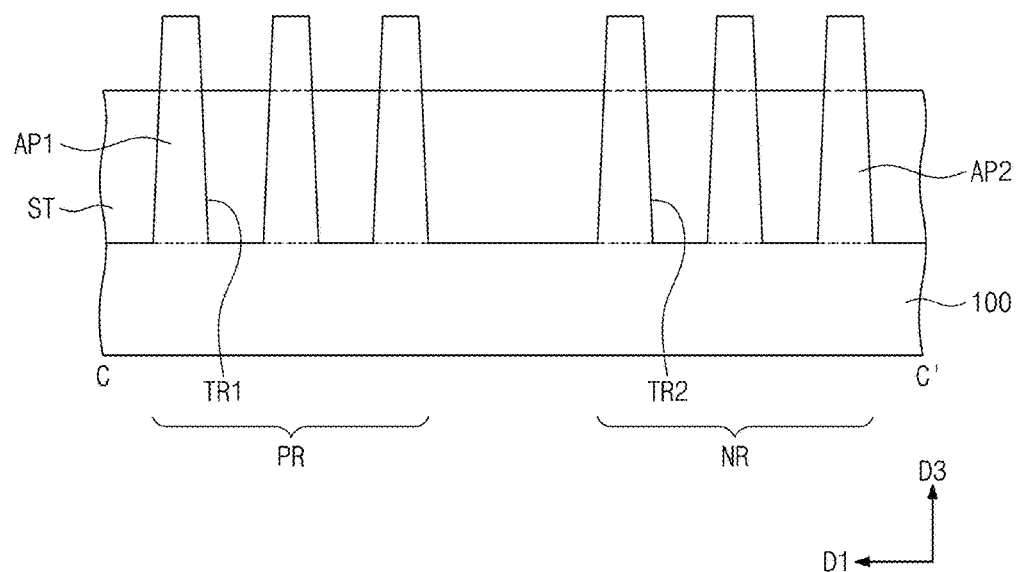
FIGS. 7C, 9C, 11C, 13C, 15C, 17C, and 19C are cross-sectional views taken along lines C-C' of FIGS. 6, 8, 10, 12, 14, 16, and 18, respectively.
Figure 8:
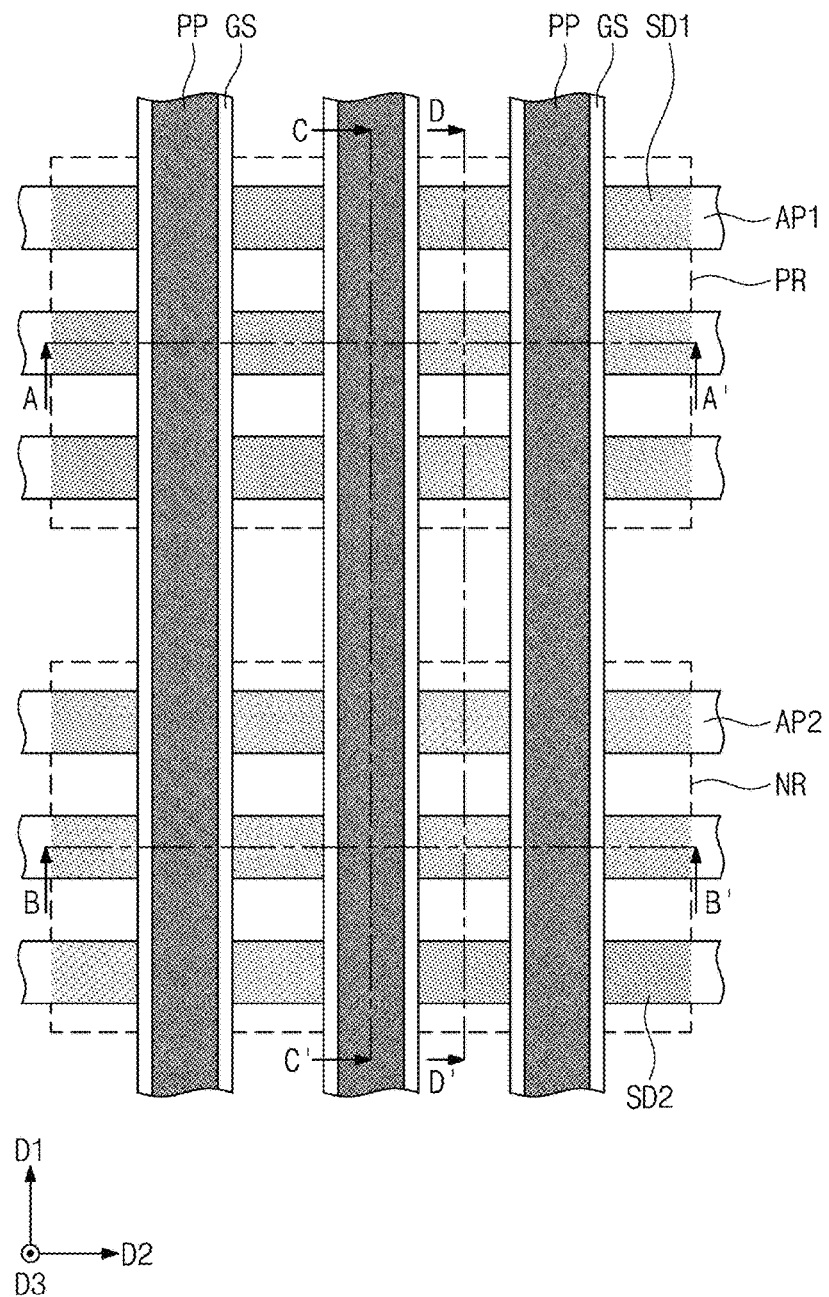
Figure 9A:
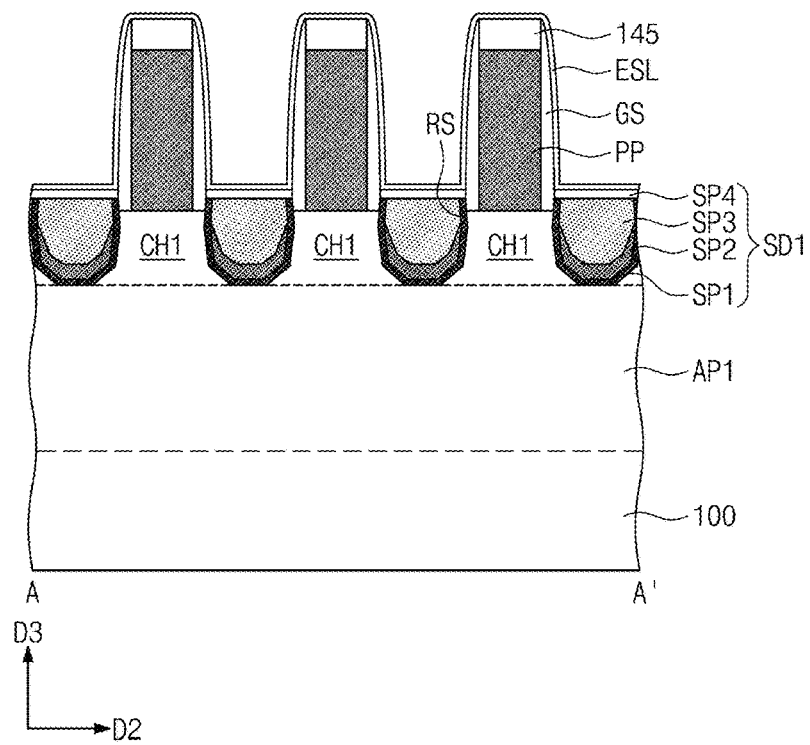
Figure 9B:
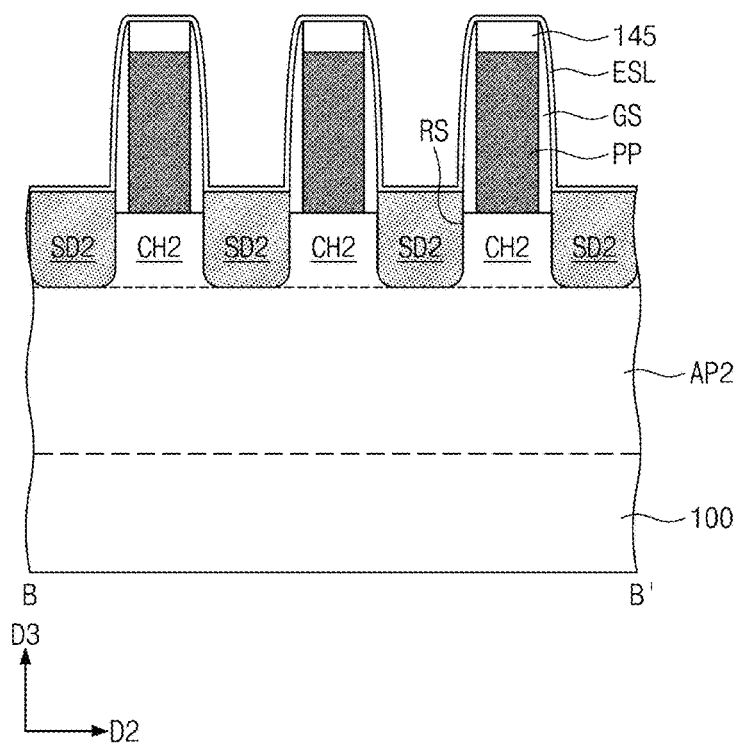
Figure 9C:
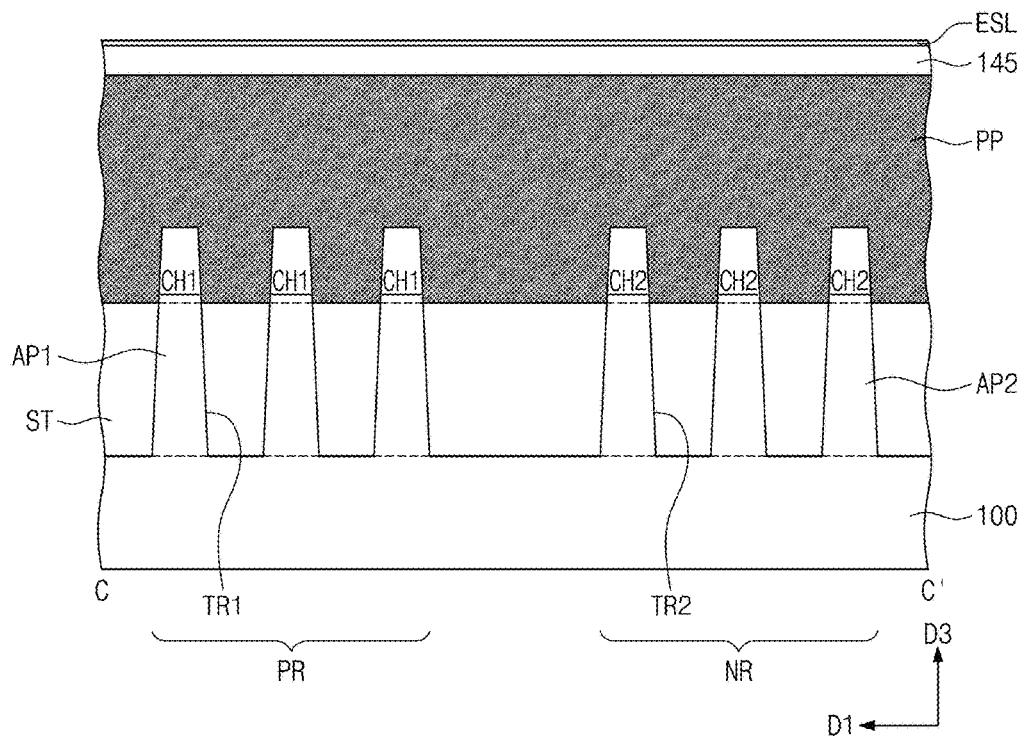
Figure 9D:
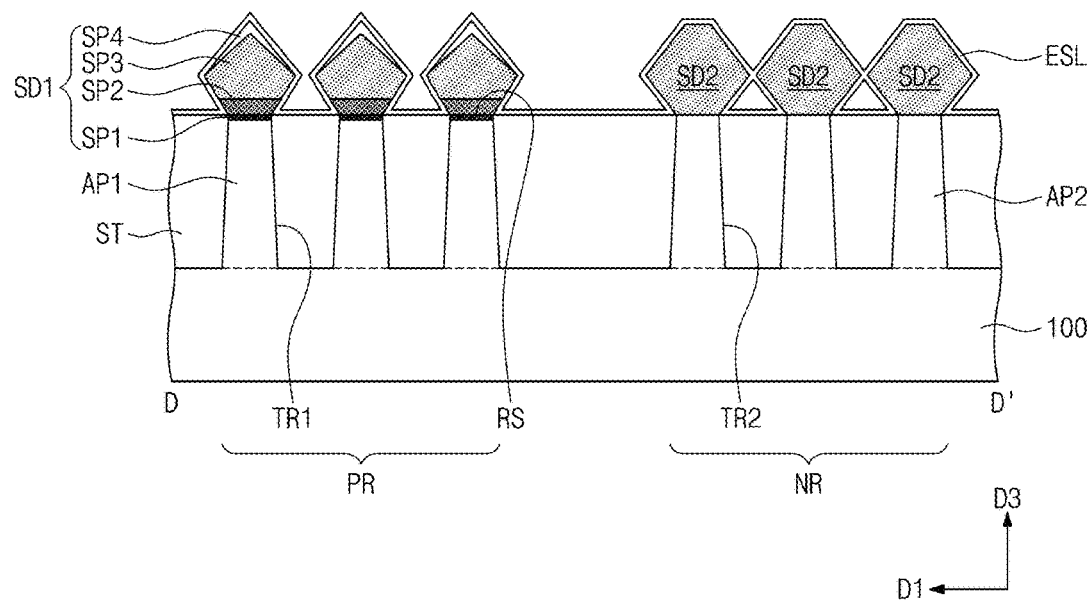
FIGS. 9D, 11D, 13D, 15D, 17D, and 19D are cross-sectional views taken along lines C-C' of FIGS. 8, 10, 12, 14, 16, and 18, respectively.
Figure 10:
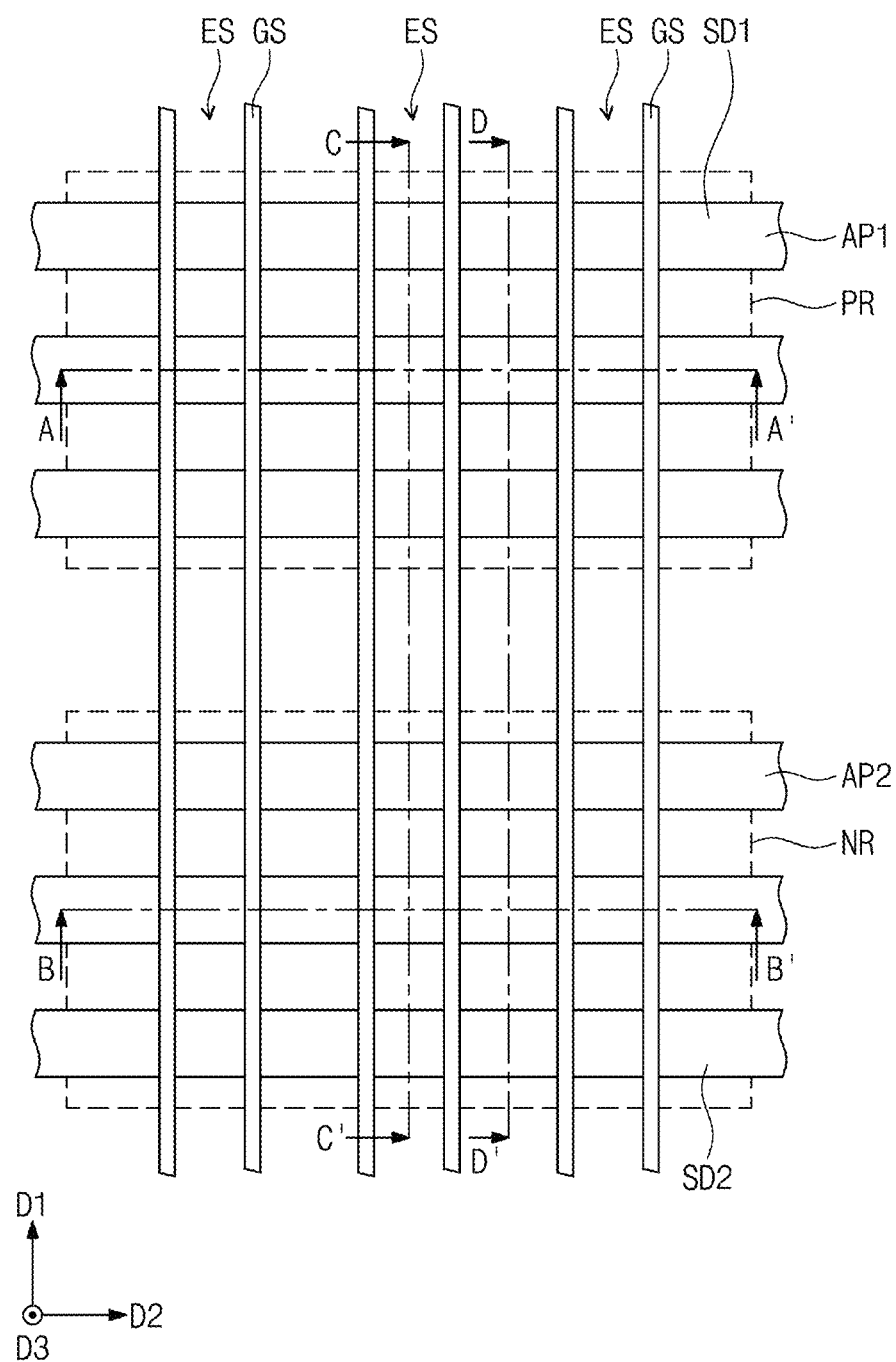
Figure 11A:
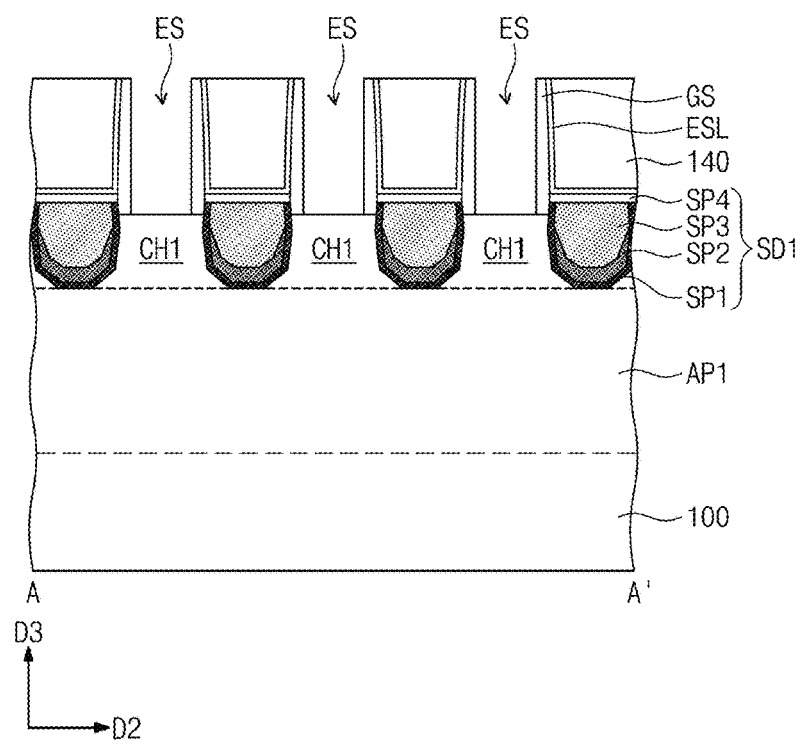
Figure 11B:
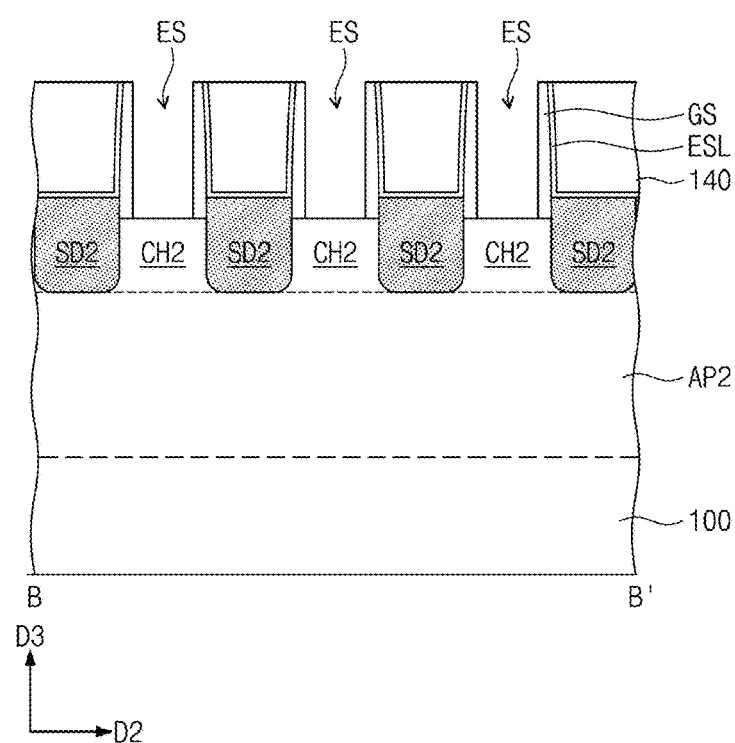
Figure 11C:
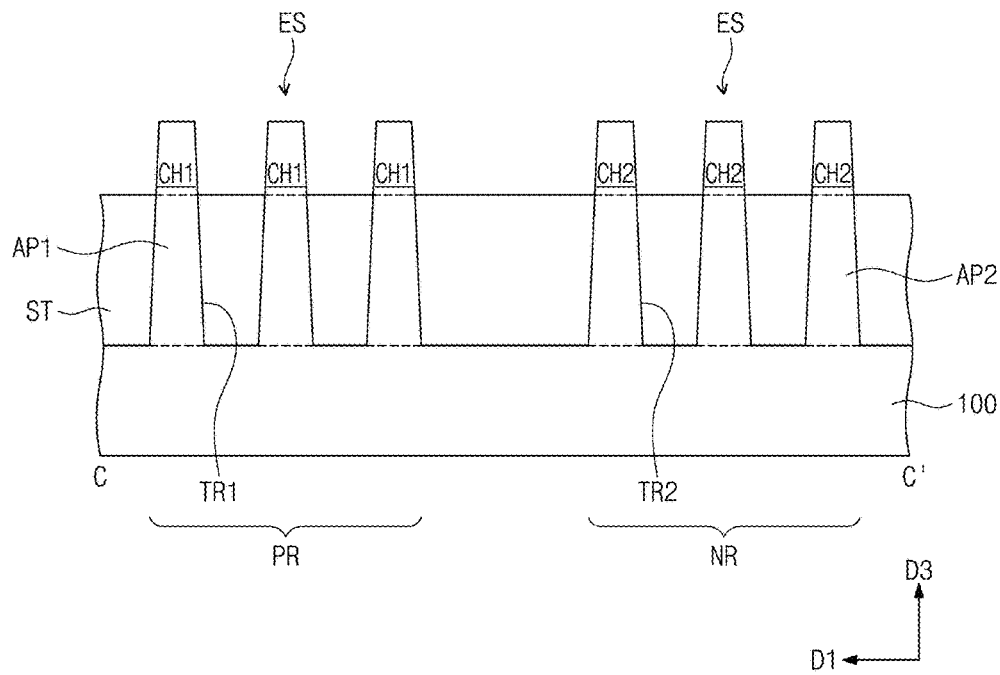
Figure 11D:
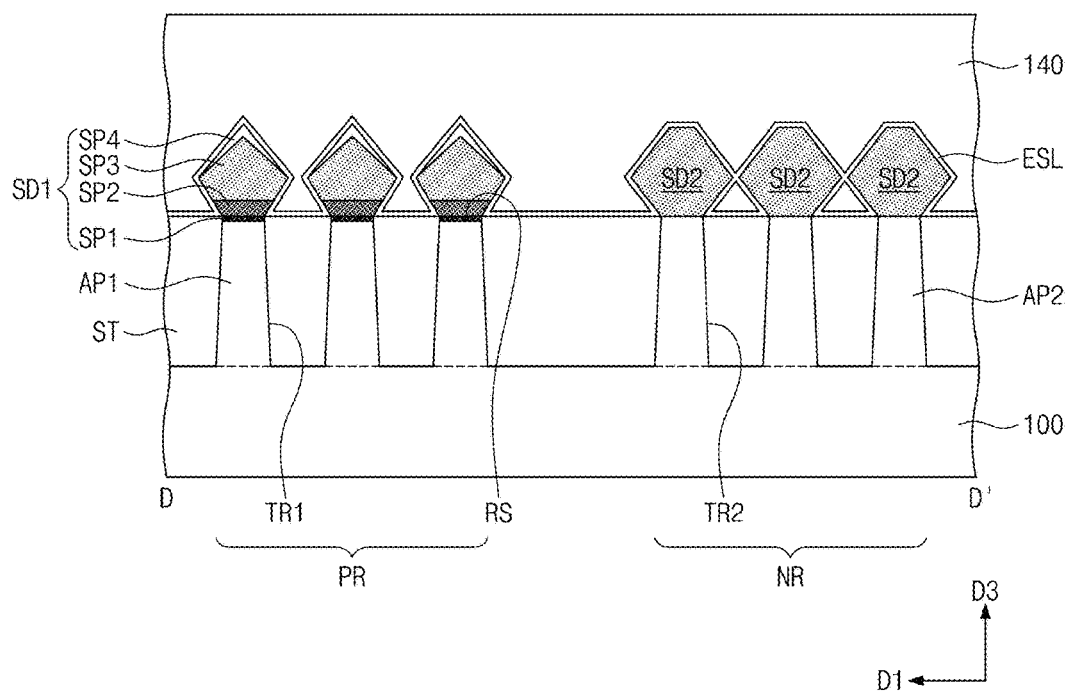
Figure 12:
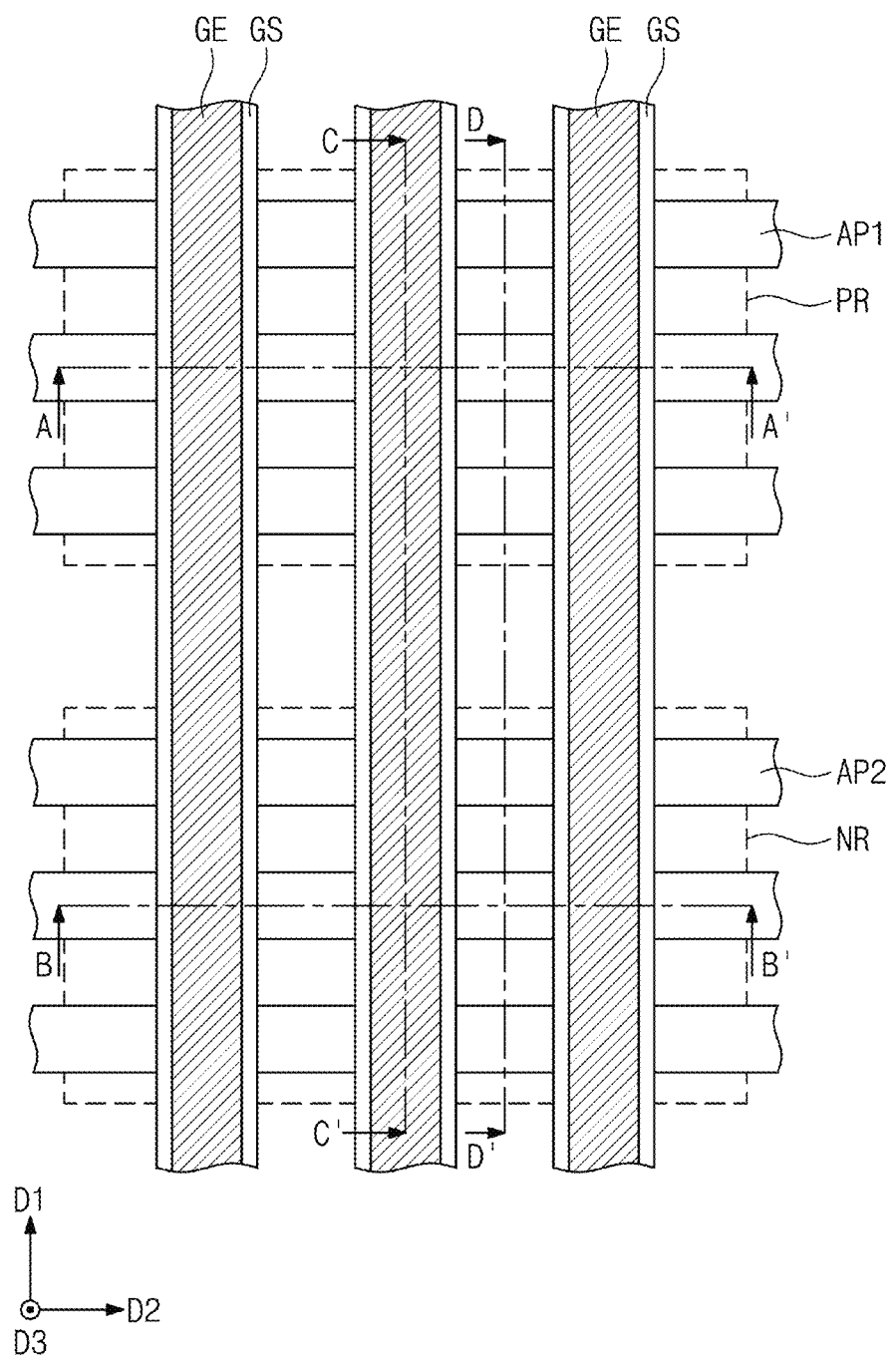
Figure 13A:
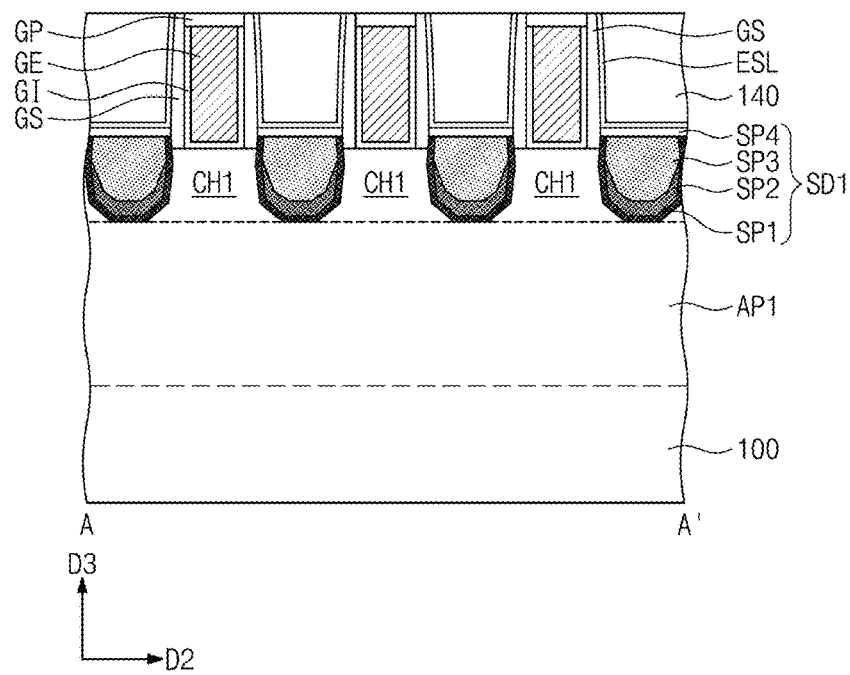
Figure 13B:
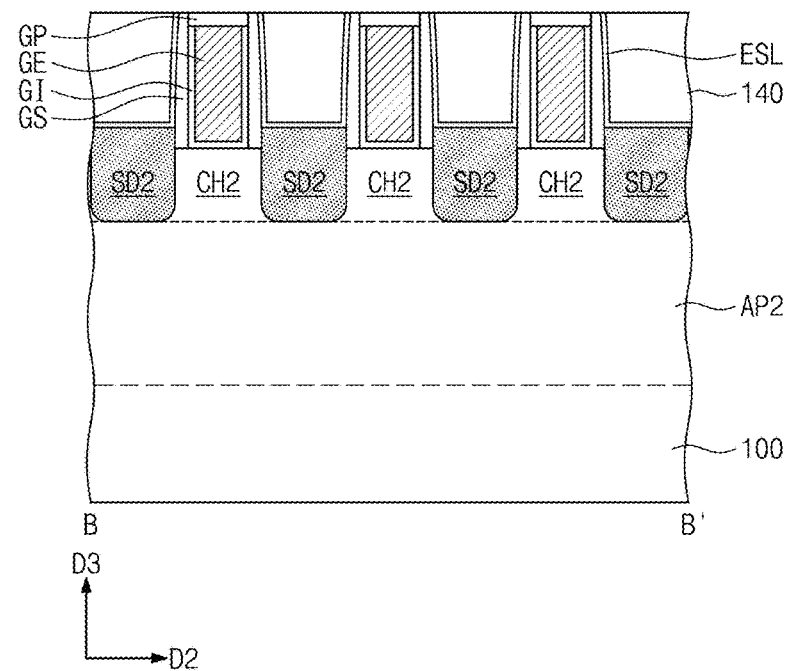
Figure 13C:
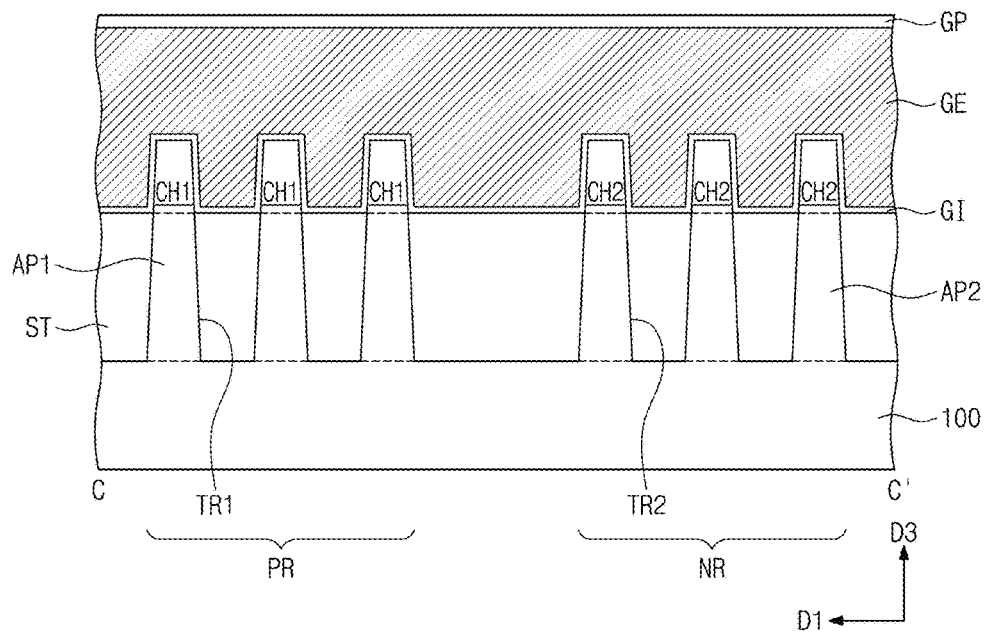
Figure 13D:
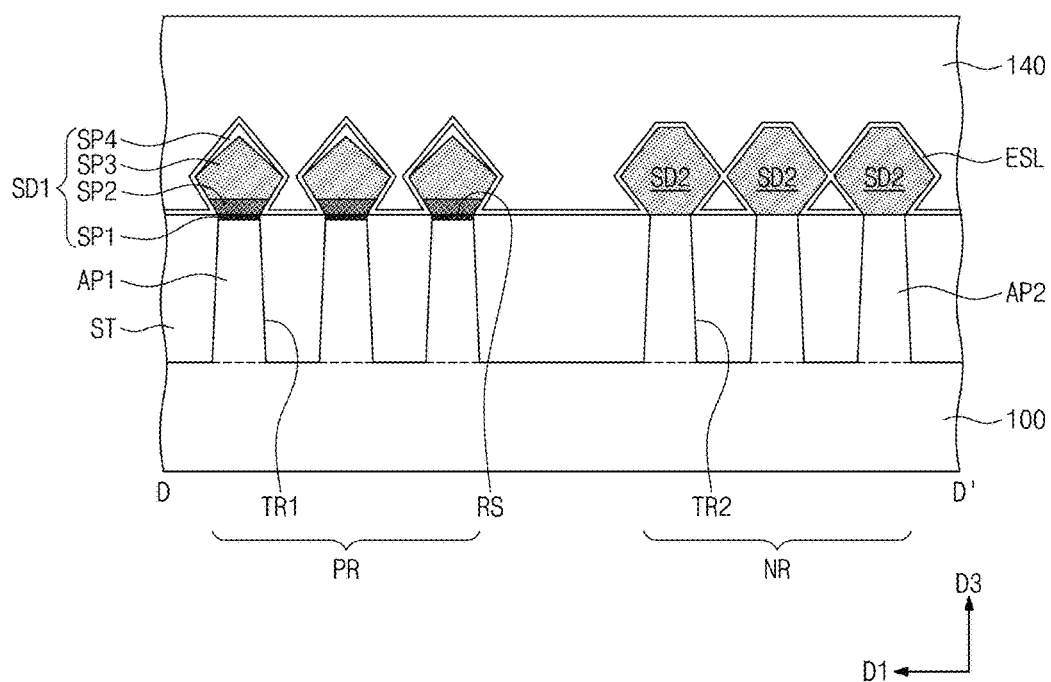
Figure 14:
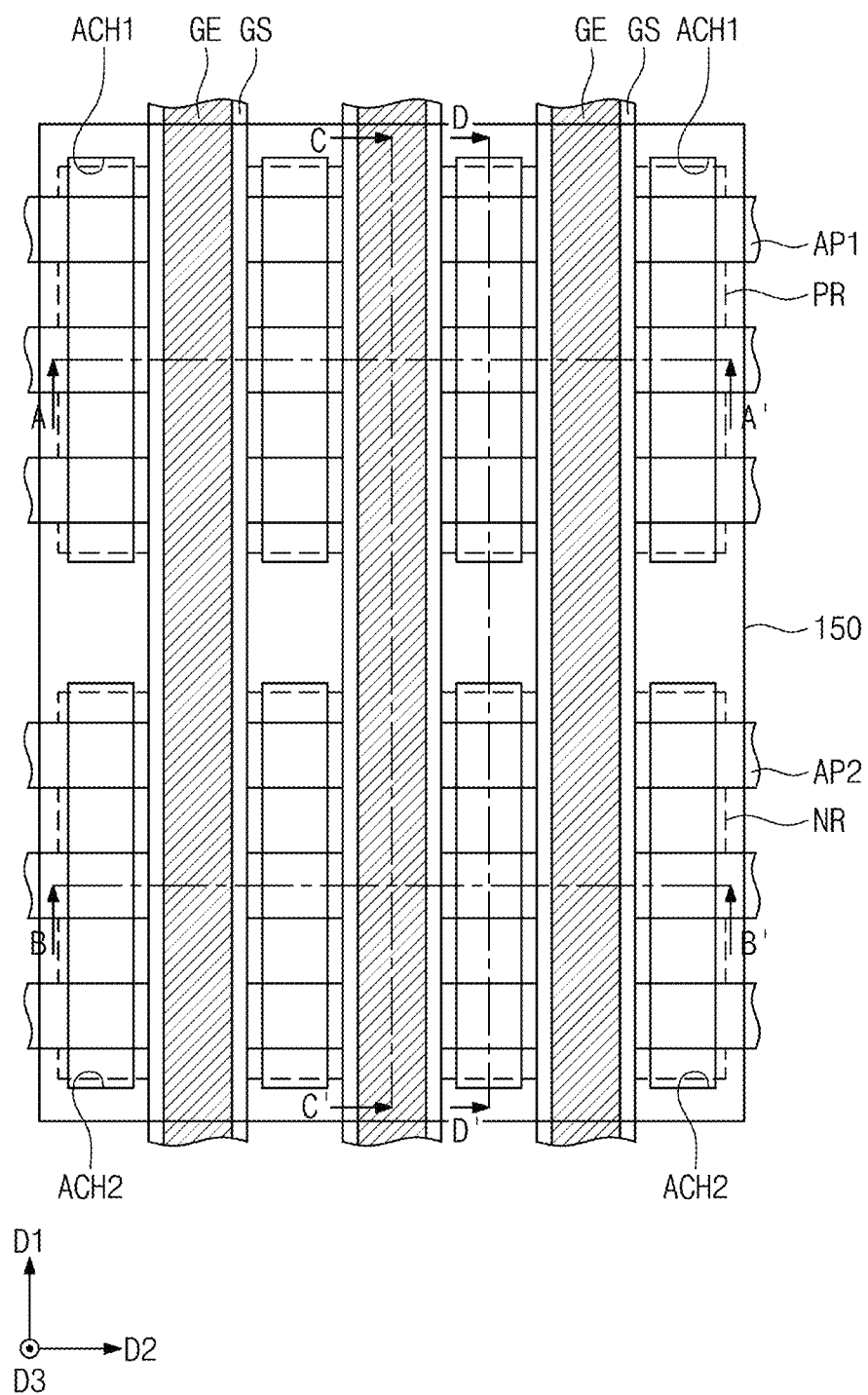
Figure 15A:
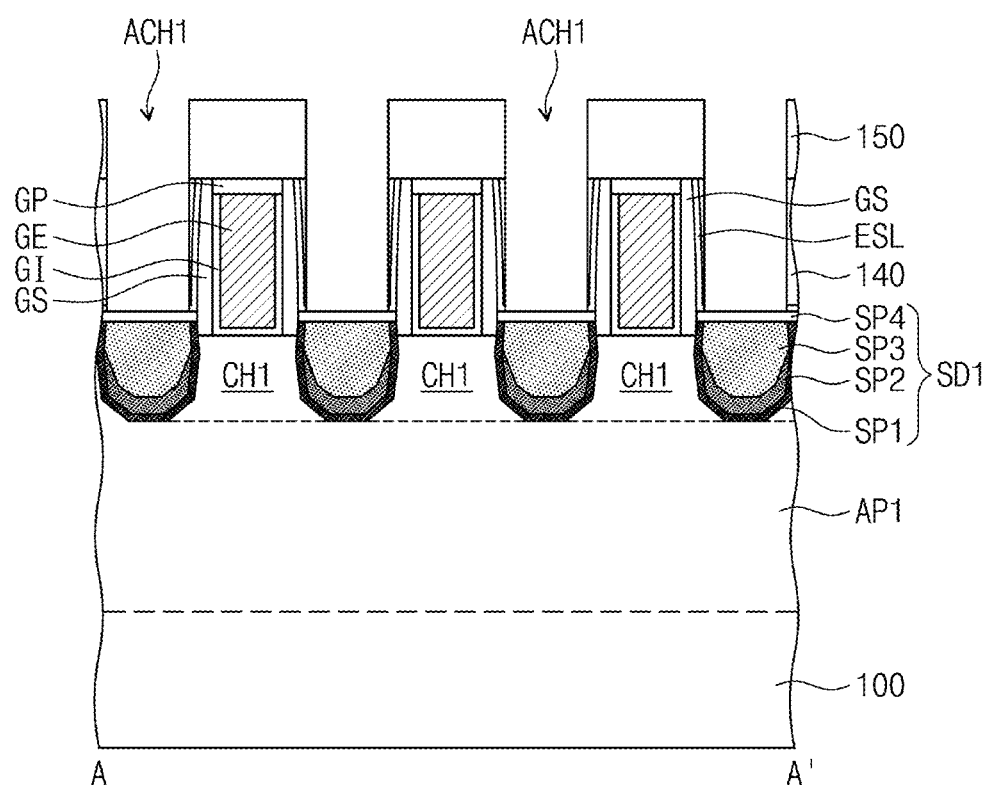
Figure 15B:
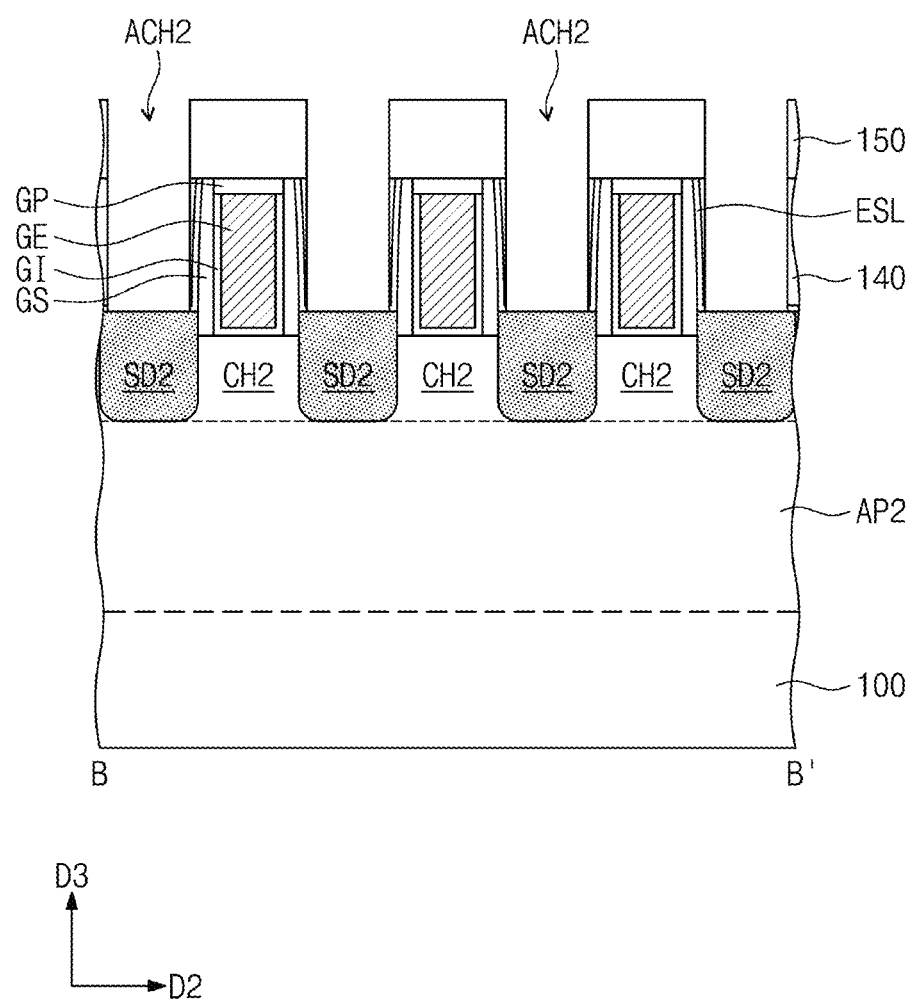
Figure 15C:
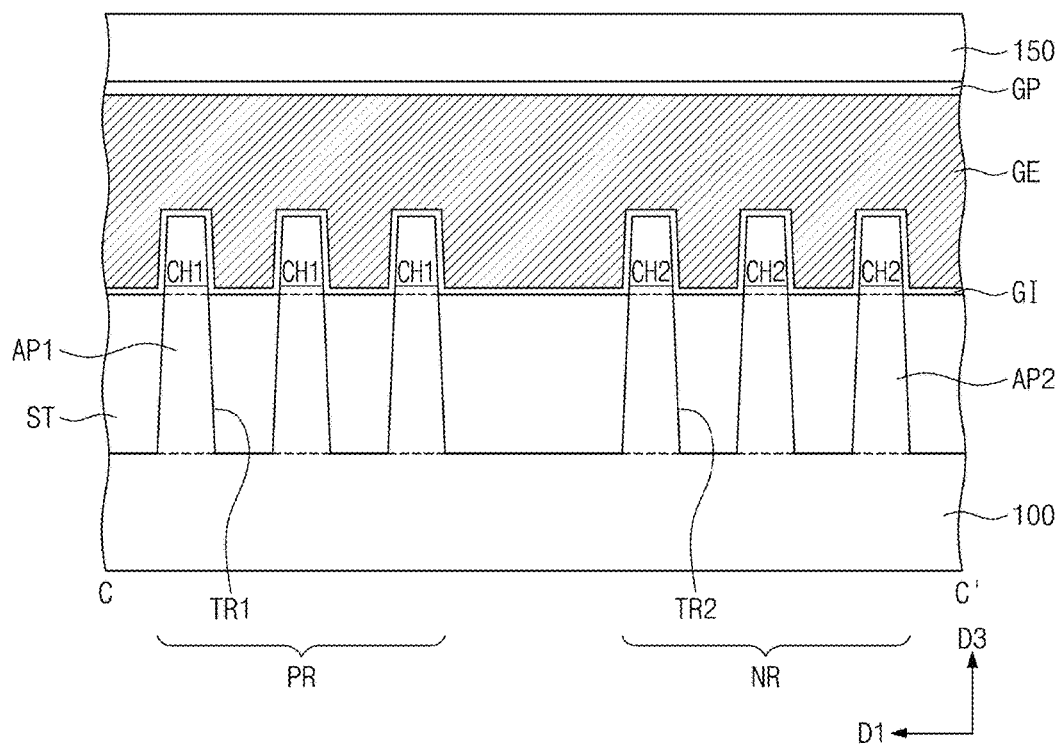
Figure 15D:
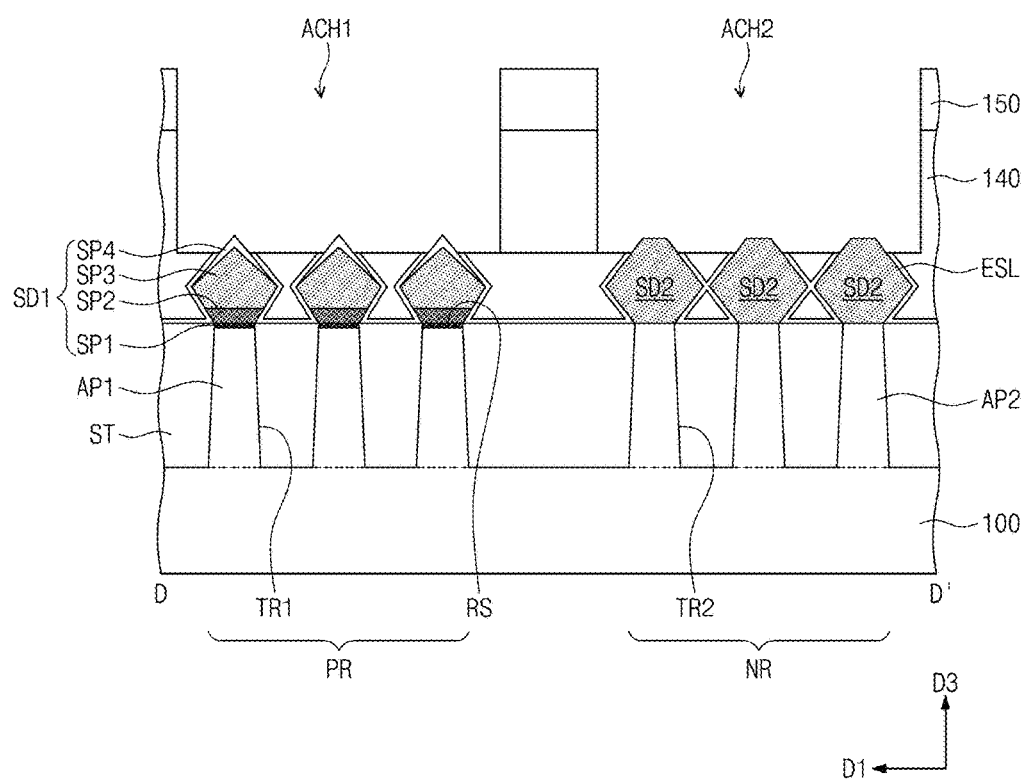
Figure 16:
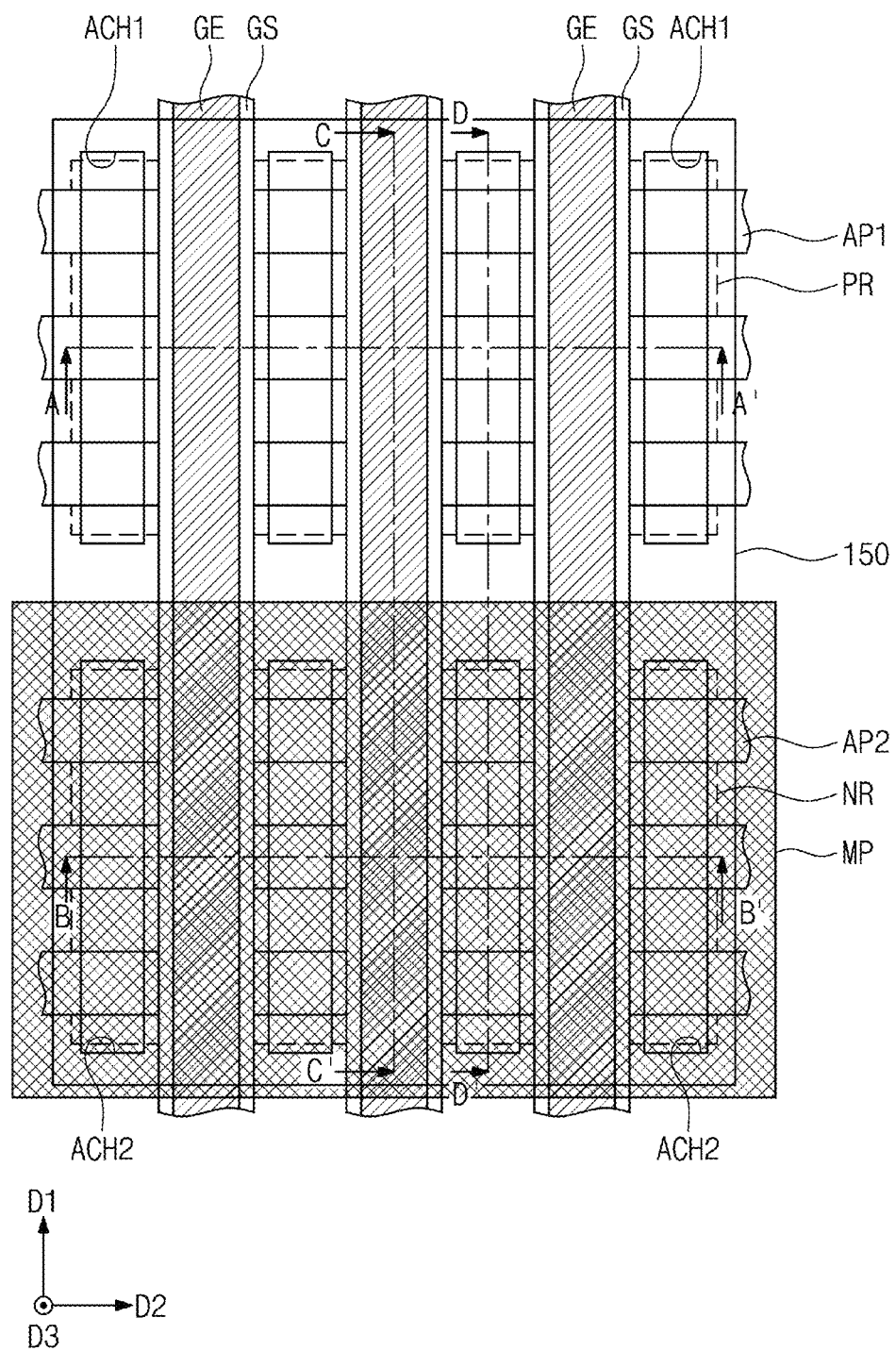
Figure 17A:
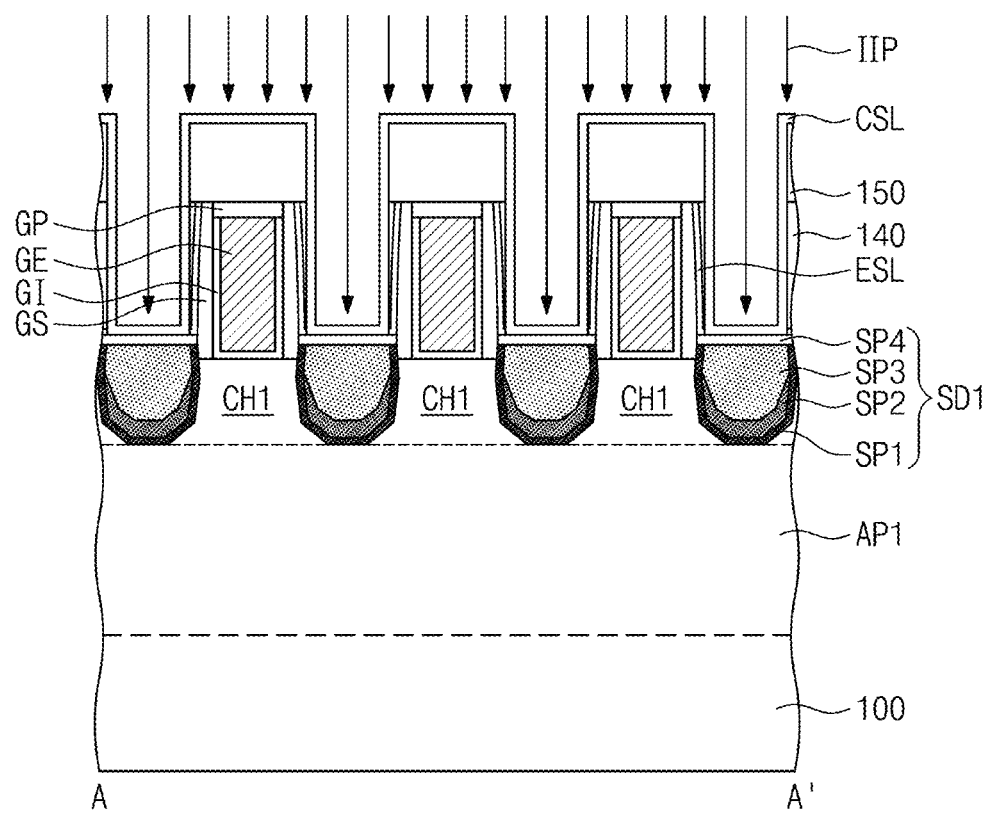
Figure 17B:
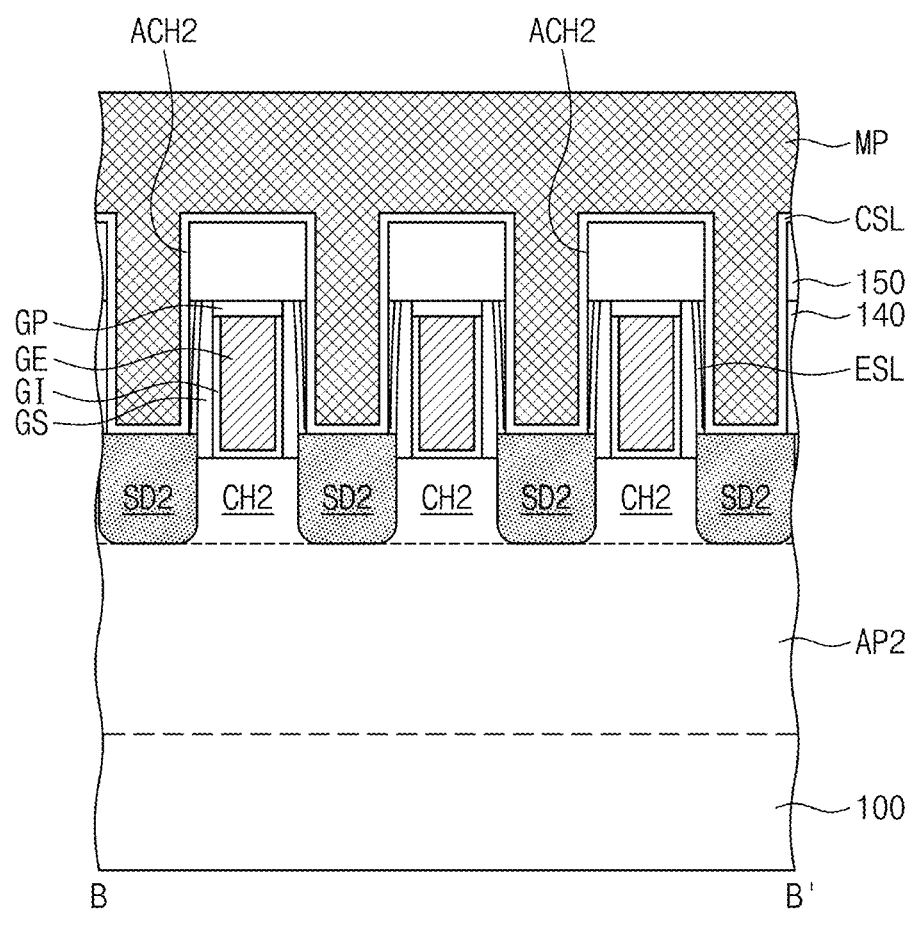
Figure 17C:
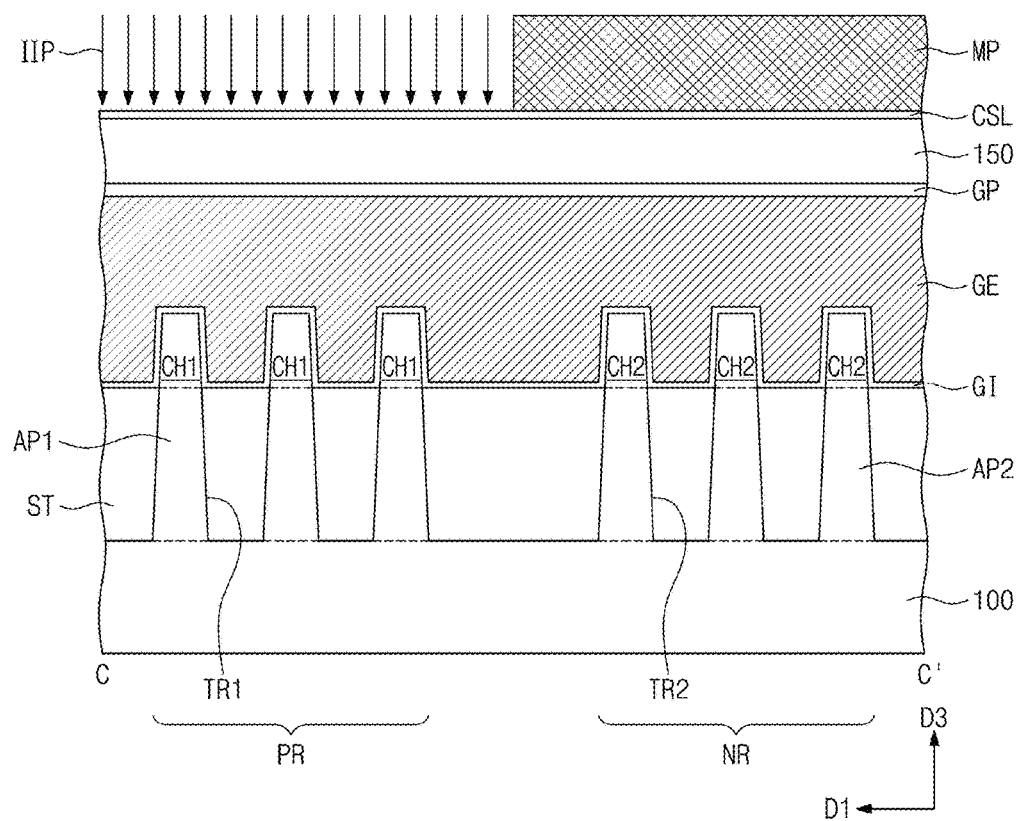
Figure 17D:
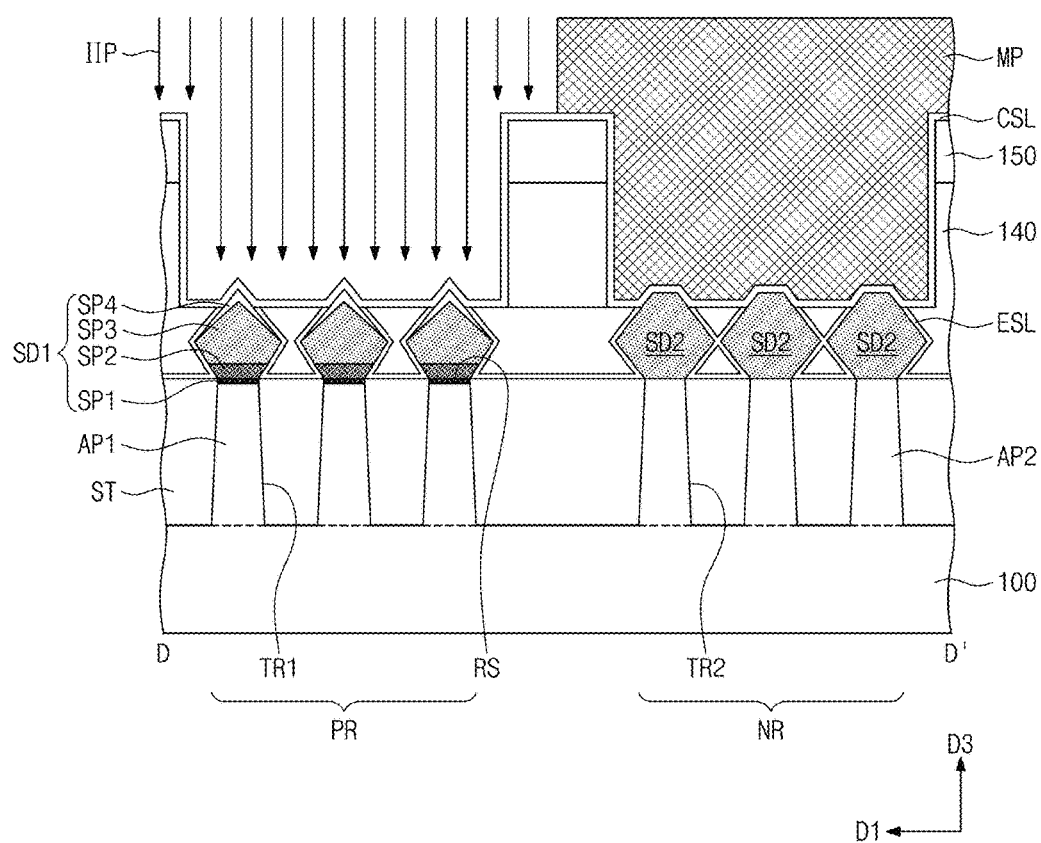
Figure 18:
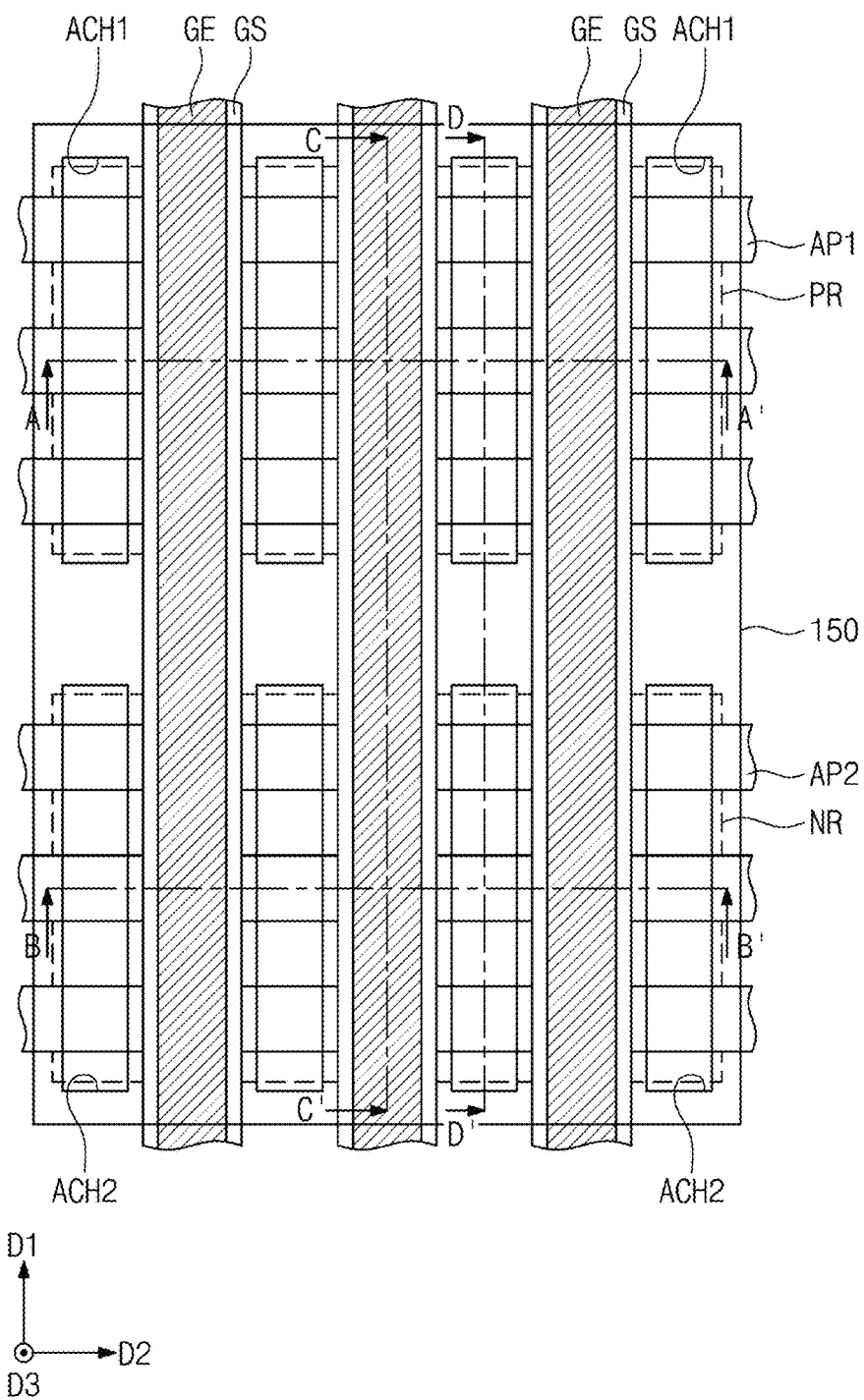
Figure 19A:
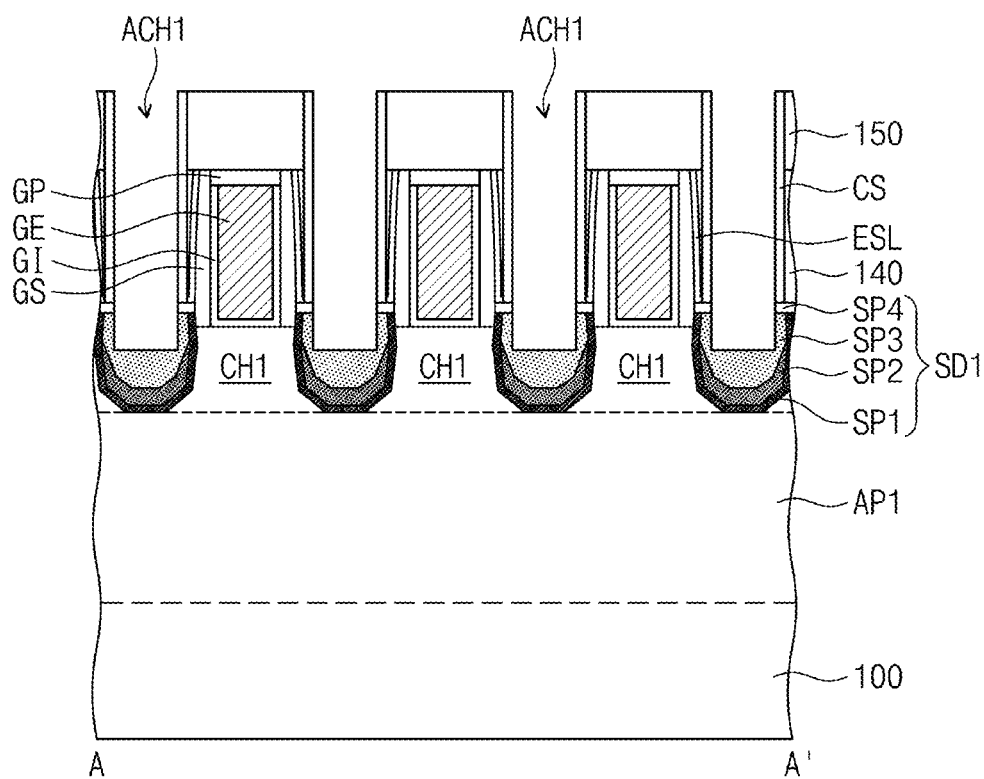
Figure 19B:
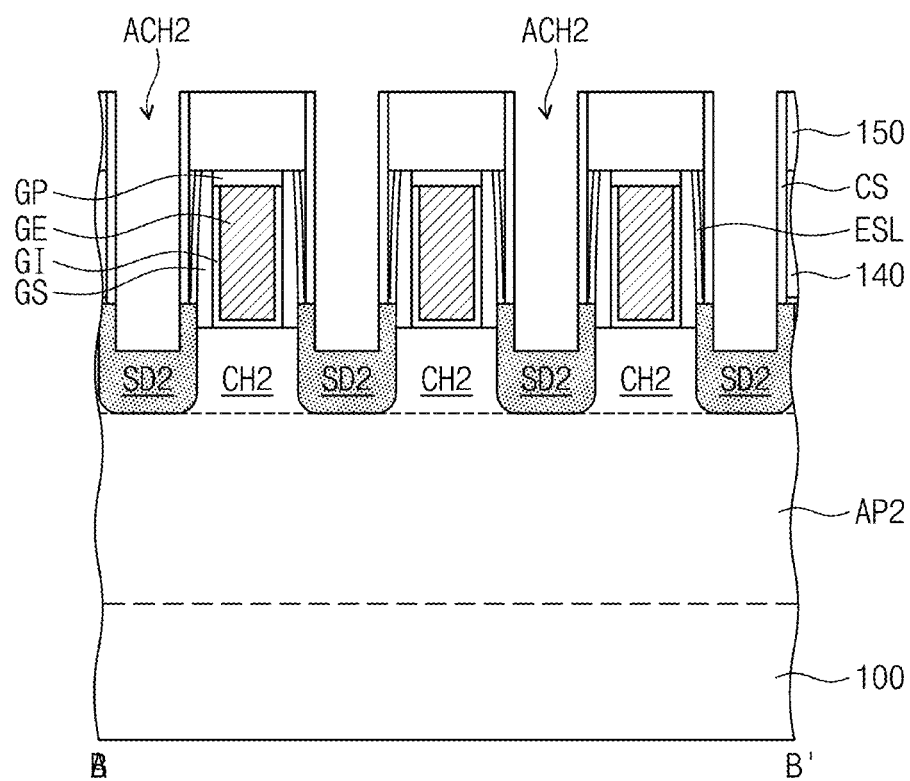
Figure 19C:
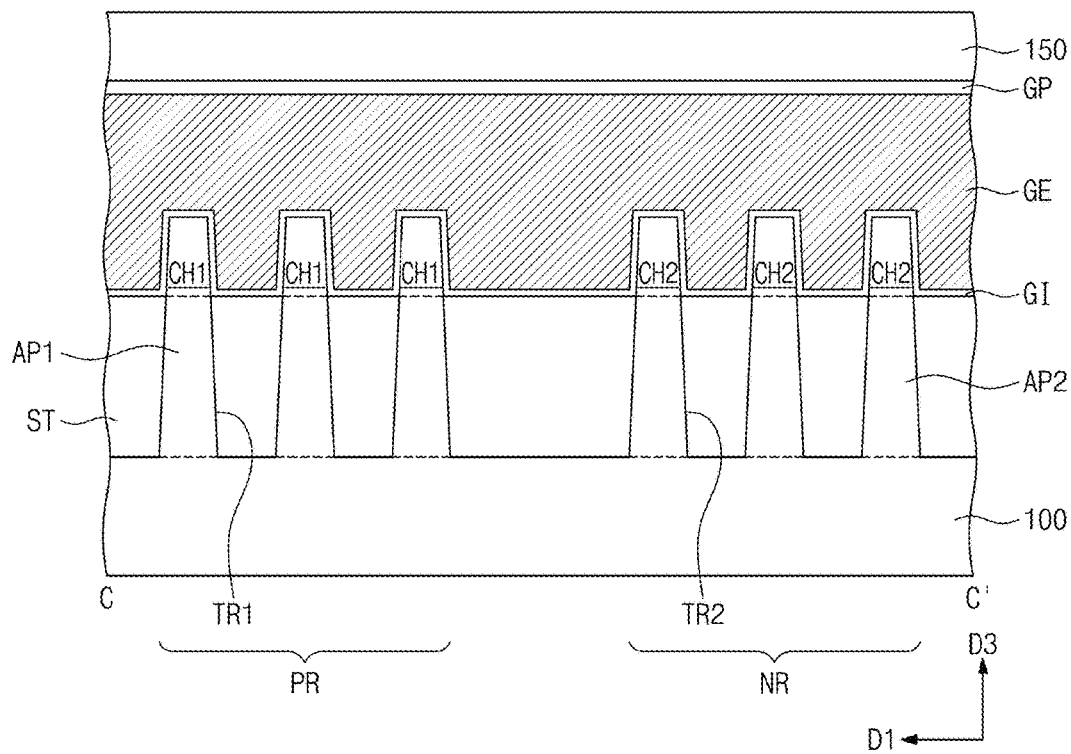
Figure 19D:
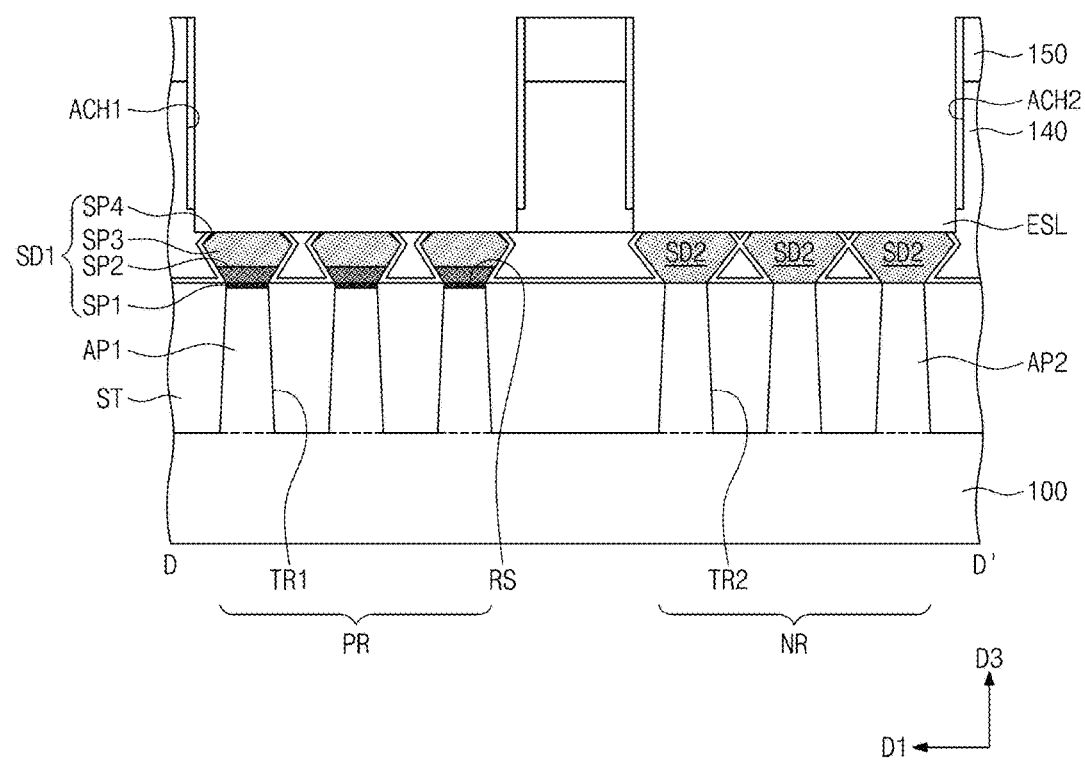

Referring to FIGS. 4, 5A, and 5B, the substrate 100 may be patterned to form the first and second active patterns AP1 and AP2. For example, the formation of the first and second active patterns AP1 and AP2 may include forming mask patterns on the substrate 100, and anisotropically etching the substrate 100 using the mask patterns as an etch mask. First trenches TR1 may be formed between the first active patterns AP1. Second trenches TR2 may be formed between the second active patterns AP2. The substrate 100 may be or include a semiconductor wafer, which is made of at least one of silicon, germanium, silicon-germanium, or semiconductor compound. As an example, the substrate 100 may be a silicon wafer.

The device isolation layers ST may be formed to fill the first and second trenches TR1 and TR2. For example, an insulating layer (e.g., a silicon oxide layer) may be formed to fill all of the first and second trenches TR1 and TR2. Thereafter, the insulating layer may be recessed to expose upper portions of the first and second active patterns AP1 and AP2. The first active patterns AP1 may constitute the PMOSFET region PR, and the second active patterns AP2 may constitute the NMOSFET region NR.

Referring to FIG. 6 and FIGS. 7A to 7C, sacrificial patterns PP may be formed to cross the first and second active patterns AP1 and AP2. Each of the sacrificial patterns PP may be a line- or bar-shaped structure extending in the first direction D1. For example, the formation of the sacrificial patterns PP may include forming a sacrificial layer on the substrate 100, forming hard mask patterns 145 on the sacrificial layer, and patterning the sacrificial layer using the hard mask patterns 145 as an etch mask. The sacrificial layer may be formed of or include a poly-silicon layer.

A pair of the gate spacers GS may be formed on opposite side surfaces of each of the sacrificial patterns PP. The formation of the gate spacers GS may include conformally forming a spacer layer on the substrate 100 and anisotropically etching the spacer layer. The spacer layer may be formed of or include at least one of SiCN, SiCON, or SiN. In certain embodiments, the spacer layer may be a multi-layered structure including at least two of SiCN, SiCON, or SiN.

Referring to FIG. 8 and FIGS. 9A to 9C, the first source/drain regions SD1 may be formed at both sides of each of the sacrificial patterns PP on the PMOSFET region PR. In detail, the recess regions RS may be formed by etching upper portions of the first active patterns AP1, and during the formation of the recess regions RS, the hard mask patterns 145 and the gate spacers GS may be used as an etch mask. A selective epitaxial growth process may be performed to form the first source/drain regions SD1, and inner side surfaces of the recess regions RS of the first active patterns AP1 may be used as a seed layer in the selective epitaxial growth process. As a result of the formation of the first source/drain regions SD1, a first channel region CH1 may be defined between a pair of the first source/drain regions SD1. As an example, the selective epitaxial growth process may include a chemical vapor deposition (CVD) process or a molecular beam epitaxy (MBE) process.

The first source/drain regions SD1 may include a second semiconductor element whose lattice constant is greater than a first semiconductor element of the substrate 100. For example, the first semiconductor element may be silicon, and the second semiconductor element may be germanium. Each of the first source/drain regions SD1 may be a multi-layered structure including a plurality of semiconductor layers.

Each of the first source/drain regions SD1 may include first to fourth semiconductor patterns SP1-SP4, which are sequentially formed on the substrate 100. The first semiconductor pattern SP1 may be formed by a first selective epitaxial growth process, in which an inner side surface of the recess region RS of the first active pattern AP1 is used as a seed layer. The first semiconductor pattern SP1 may contain a low concentration of the second semiconductor element. The first semiconductor pattern SP1 may be doped with the low concentration of impurities, in an in-situ doping manner. Alternatively, the first semiconductor pattern SP1 may be doped with the low concentration of impurities, after the formation of the first semiconductor pattern SP1. In some embodiments, the first semiconductor pattern SP1 may include silicon-germanium (SiGe) doped with boron. The atomic percentage of germanium (Ge) in the first semiconductor pattern SP1 may range from 15 at % to 25 at %.

The first selective epitaxial growth process may be performed at a pressure that is higher than those in second and third selective epitaxial growth processes. As an example, the first selective epitaxial growth process may be performed at a pressure ranging from 50 Torr to 250 Torr. Accordingly, the first semiconductor pattern SP1 may be conformally formed on an inner side surface of the recess region RS.

The second semiconductor pattern SP2 may be formed by a second selective epitaxial growth process, in which the first semiconductor pattern SP1 is used as a seed layer. The second semiconductor pattern SP2 may contain the second semiconductor element, whose concentration is higher than that of the first semiconductor pattern SP1. The second semiconductor pattern SP2 may be doped with a high concentration of impurities in an in-situ doping manner (e.g., without a vacuum break and in the same chamber in which the first semiconductor pattern SP1 was formed). Alternatively, after the formation of the first semiconductor pattern SP1, the second semiconductor pattern SP2 may be doped with a high concentration of impurities (e.g. in a non-in-situ process). As an example, the second semiconductor pattern SP2 may include silicon-germanium (SiGe) doped with boron (B).

The atomic percentage of germanium (Ge) in the second semiconductor pattern SP2 may range from 25 at % to 50 at %.

The second selective epitaxial growth process may be performed at a pressure lower than that of the first selective epitaxial growth process. As an example, the second selective epitaxial growth process may be performed at a pressure ranging from 10 Torr to 50 Torr. Accordingly, a thickness of the second semiconductor pattern SP2 may be smaller on a side portion of an inner surface of the first semiconductor pattern SP1 than on a bottom portion of the inner surface of the first semiconductor pattern SP1. The thickness of the second semiconductor pattern SP2 on the inner bottom surface of the first semiconductor pattern SP1 may be greater than a thickness of the first semiconductor pattern SP1.

The third semiconductor pattern SP3 may be formed by a third selective epitaxial growth process, in which the second semiconductor pattern SP2 is used as a seed layer. The third semiconductor pattern SP3 may contain the second semiconductor element whose concentration is higher than the second semiconductor pattern SP2. The third semiconductor pattern SP3 may be doped in an in-situ manner and may have a concentration lower than that of the second semiconductor pattern SP2. As an example, the third semiconductor pattern SP3 may include silicon-germanium (SiGe) doped with boron in an in-situ manner. The atomic percentage of germanium (Ge) in the third semiconductor pattern SP3 may range from 50 at % to 75 at %.

The third selective epitaxial growth process may be performed at a pressure lower than that of the first selective epitaxial growth process. As an example, the third selective epitaxial growth process may be performed at a pressure ranging from 10 Torr to 50 Torr.

The fourth semiconductor pattern SP4 may be formed by a fourth selective epitaxial growth process, in which the third semiconductor pattern SP3 is used as a seed layer. The fourth semiconductor pattern SP4 may contain the first semiconductor element that is of the same kind as that in the substrate 100. As an example, the fourth semiconductor pattern SP4 may include a silicon pattern with a single crystalline structure. The first to fourth selective epitaxial growth processes may be sequentially performed in the same chamber.

The second source/drain regions SD2 may be formed at both sides (e.g., opposite sides) of each of the sacrificial patterns PP on the NMOSFET region NR. In detail, recess regions may be formed by etching upper portions of the second active patterns AP2, and during the formation of the recess regions, the hard mask patterns 145 and the gate spacers GS may be used as an etch mask. A selective epitaxial growth process, in which inner side surfaces of the recess regions of the second active patterns AP2 are used as a seed layer, may be performed to form the second source/drain regions SD2. As a result of the formation of the second source/drain regions SD2, a second channel region CH2 may be defined between a pair of the second source/drain regions SD2. As an example, the second source/drain regions SD2 may include silicon.

The first source/drain regions SD1 and the second source/drain regions SD2 may be sequentially formed by different processes. For example, the first source/drain regions SD1 and the second source/drain regions SD2 may not be formed at the same time.

The etch stop layer ESL may be conformally formed on the substrate 100. The etch stop layer ESL may cover the first and second source/drain regions SD1 and SD2. The etch stop layer ESL may be formed of or include a silicon nitride layer.

Referring to FIG. 10 and FIGS. 11A to 11D, the first interlayered insulating layer 140 may be formed to cover the first and second source/drain regions SD1 and SD2, the hard mask patterns 145, and the gate spacers GS. As an example, the first interlayered insulating layer 140 may be formed of or include a silicon oxide layer.

Thereafter, the first interlayered insulating layer 140 may be planarized to expose the top surfaces of the sacrificial patterns PP. The planarization of the first interlayered insulating layer 140 may be performed using an etch-back or chemical mechanical polishing (CMP) process. During the planarization process, all of the hard mask patterns 145 may be removed. As a result, the first interlayered insulating layer 140 may have a top surface that is coplanar with the top surfaces of the sacrificial patterns PP and the gate spacers GS. In some embodiments, the exposed sacrificial patterns PP may be selectively removed. As a result of the removal of the sacrificial patterns PP, empty spaces ES may be formed.

Referring to FIG. 12 and FIGS. 13A to 13D, the gate dielectric pattern GI, the gate electrode GE, and the gate capping pattern GP may be formed in each of the empty spaces ES. The gate dielectric pattern GI may be conformally formed, and thus, the whole region of the empty space ES may not be filled with the gate dielectric pattern GI. The gate dielectric pattern GI may be formed by an atomic layer deposition (ALD) process or a chemical oxidation process. The gate dielectric pattern GI may be formed of or include a high-k dielectric material. For example, the high-k dielectric material may be formed of or include at least one of hafnium oxide, hafnium silicon oxide, lanthanum oxide, zirconium oxide, zirconium silicon oxide, tantalum oxide, titanium oxide, barium strontium titanium oxide, barium titanium oxide, strontium titanium oxide, lithium oxide, aluminum oxide, lead scandium tantalum oxide, or lead zinc niobate.

The formation of the gate electrode GE may include forming a gate electrode layer to completely fill the empty space ES and then planarizing the gate electrode layer. As an example, the gate electrode layer may be formed of or include at least one of conductive metal nitrides (e.g., titanium nitride or tantalum nitride) or metals (e.g., titanium, tantalum, tungsten, copper, or aluminum).

Thereafter, upper portions of the gate electrodes GE may be recessed. The gate capping patterns GP may be formed on the gate electrodes GE. The gate capping patterns GP may be formed to completely fill recessed regions of the gate electrodes GE. The gate capping patterns GP may be formed of or include at least one of SiON, SiCN, SiCON, or SiN.

Referring to FIG. 14 and FIGS. 15A to 15D, the second interlayered insulating layer 150 may be formed on the first interlayered insulating layer 140 and the gate capping patterns GP. The second interlayered insulating layer 150 may be formed of or include a silicon oxide layer or a low-k oxide layer. The low-k oxide layer may include, for example, a carbon-doped silicon oxide layer such as SiCOH. The second interlayered insulating layer 150 may be formed by a CVD process.

First and second contact holes ACH1 and ACH2 may be formed to penetrate the second interlayered insulating layer 150 and the first interlayered insulating layer 140 and to expose the first and second source/drain regions SD1 and SD2, respectively. In some embodiments, the first and second contact holes ACH1 and ACH2 may be formed by selectively etching only the first and second interlayered insulating layers 140 and 150. During the etching process, the etch stop layer ESL may be used to protect the first and second source/drain regions SD1 and SD2. The etch stop layer ESL covering the first and second source/drain regions SD1 and SD2 may be removed during the etching process.

The first contact holes ACH1 may be formed to expose upper portions of the first source/drain regions SD1, and the second contact holes ACH2 may be formed to expose upper portions of the second source/drain regions SD2. As an example, the first and second contact holes ACH1 and ACH2 may be self-align contact holes that are formed in self-aligned manner by the gate capping patterns GP and the gate spacers GS.

Referring to FIG. 16, FIGS. 17A to 17D, and FIG. 20, a contact spacer layer CSL may be conformally formed on the substrate 100. The contact spacer layer CSL may be formed to cover side and bottom surfaces of the first and second contact holes ACH1 and ACH2. As an example, the contact spacer layer CSL may be formed of or include at least one of SiCN, SiCON, or SiN. The mask pattern MP may be formed to cover the NMOSFET region NR. The mask pattern MP may be formed to selectively expose the PMOSFET region PR.

An ion implantation process IIP may be performed to dope the entire top surface of the substrate 100 with gallium (Ga) (in S100). As a result of the ion implantation process IIP, the upper portions of the first source/drain regions SD1 may be doped with gallium (Ga). In detail, the third semiconductor patterns SP3 of the first source/drain regions SD1 may be doped with gallium (Ga). Meanwhile, the second source/drain regions SD2 may be prevented from being doped with gallium (Ga) by the mask pattern MP. For example, the second source/drain regions SD2 may be gallium-free region.

As an example, the ion implantation process IIP may be performed at a dose ranging from 1.0 E14/cm$^2$ to 1.0 E16/cm$^2$ and at a power ranging from 1 keV to 10 keV. The ion implantation process IIP may be performed at a low temperature (e.g., from −100° C. to 0° C.), a middle temperature (e.g., from 0° C. to 100° C.), or a high temperature (e.g., from 100° C. to 500° C.). A process condition of the ion implantation process IIP may not be particularly limited to a specific one and may be adaptively selected by the skilled person in the art. In a silicon-germanium (SiGe) layer, gallium (Ga) may have relatively high solubility. Accordingly, the third semiconductor patterns SP3 of the first source/drain regions SD1 may contain a relatively high concentration of gallium (Ga).

A first annealing process may be performed on the first source/drain regions SD1 doped with gallium (Ga) (in S200). The gallium (Ga) doped by the first annealing process may be diffused into the first source/drain regions SD1. In detail, the first annealing process may be performed for a period of milliseconds or nanoseconds. As an example, the first annealing process may be a low-temperature soak annealing process, a flash lamp annealing process, a laser annealing process, or a spike annealing process. Meanwhile, the contact spacer layer CSL may be used to prevent amorphization of the first source/drain regions SD1, which may be caused by the first annealing process, and to prevent the doped gallium (Ga) from being lost.

Referring to FIG. 18 and FIGS. 19A to 19D, the mask pattern MP may be removed. The contact spacer layer CSL may be anisotropically etched to form the contact spacers CS. During the anisotropic etching process, upper portions of the first and second source/drain regions SD1 and SD2 may be over-etched. For example, the contact spacer layer CSL on the first and second source/drain regions SD1 and SD2 may be removed, and then, the upper portions of the first and second source/drain regions SD1 and SD2 may be etched. Accordingly, the first and second contact holes ACH1 and ACH2 may be further extended toward a bottom surface of the substrate 100. Bottom surfaces of the first and second contact holes ACH1 and ACH2 may be higher than the first level LV1, at which the first source/drain region SD1 has the maximum width W1 (e.g., see FIGS. 2D and 3).

Referring back to FIG. 1 and FIGS. 2A to 2D, the contact patterns AC may be formed in the first and second contact holes ACH1 and ACH2 to be in contact with the first and second source/drain regions SD1 and SD2. The metal silicide layers SC may be formed between the contact patterns AC and the first and second source/drain regions SD1 and SD2. Each of the contact patterns AC may include the conductive pillar 165 and the barrier layer 160 enclosing the conductive pillar 165.

In detail, the barrier layer 160 may be formed to partially fill the first and second contact holes ACH1 and ACH2. The barrier layer 160 may include a metal layer and a metal nitride layer. The metal layer may include at least one of titanium, tantalum, tungsten, nickel, cobalt, or platinum. The metal nitride layer may include at least one of titanium nitride (TiN), tantalum nitride (TaN), tungsten nitride (WN), nickel nitride (NiN), cobalt nitride (CoN), or platinum nitride (PtN). Thereafter, a second annealing process may be performed on the substrate 100 to form the metal silicide layers SC. During the second annealing process, a metallic element of the barrier layer 160 and a semiconductor element of the first and second source/drain regions SD1 and SD2 may react with each other, thereby forming the metal silicide layers SC. The second annealing process may be performed for long time, compared with the first annealing process, and in certain embodiments, the second annealing process may be a rapid thermal annealing process. The metal silicide layers SC may be formed of or include at least one of metal silicides (e.g., titanium silicide, tantalum silicide, tungsten silicide, nickel silicide, or cobalt silicide).

During the formation of the metal silicide layer SC, segregation of gallium (Ga) may occur in the third semiconductor pattern SP3 in contact with the metal silicide layer SC. Accordingly, the third semiconductor pattern SP3 may contain a relatively high concentration of gallium (Ga).

A conductive layer may be formed to fully fill the first and second contact holes ACH1 and ACH2. The conductive layer may be planarized to expose the top surface of the second interlayered insulating layer 150, and as a result of the planarization process, the conductive pillar 165 may be formed. The conductive pillar 165 may include at least one of metallic materials (e.g., aluminum, copper, tungsten, molybdenum, and cobalt).

In some embodiments, the contact pattern AC may be formed to be in contact with the third semiconductor pattern SP3 containing the relatively high concentration of gallium (Ga). Thus, electric resistance between the contact pattern AC and the first source/drain region SD1 may be reduced.

In certain embodiments, the first annealing process S200 may be performed after the formation of the barrier layer 160. For example, the first and second annealing processes may be sequentially performed after the formation of the barrier layer 160.

Figure 21:
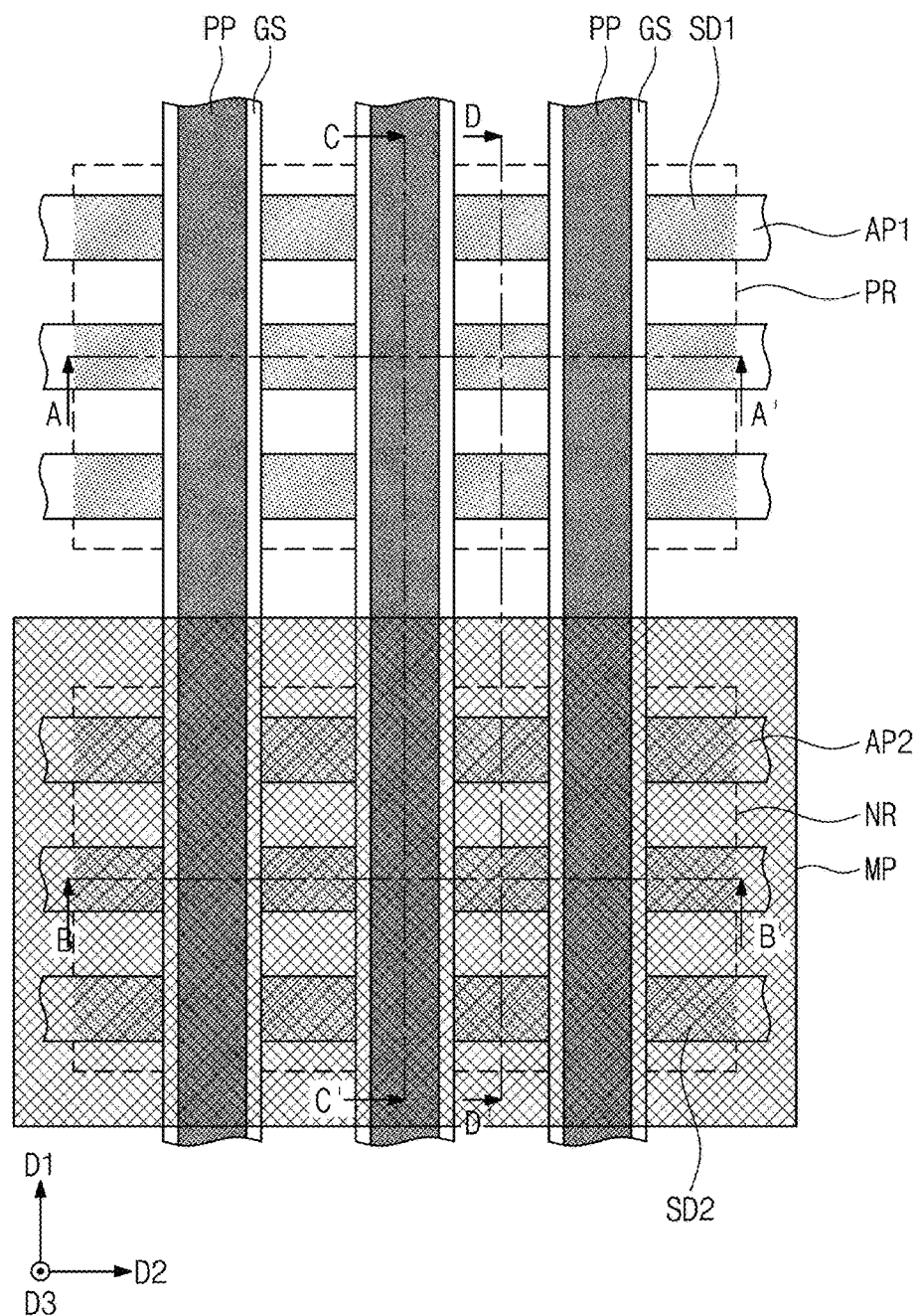
FIG. 21 is a plan view illustrating a method of fabricating a semiconductor device according to some embodiments of the present disclosure.
Figure 22A:
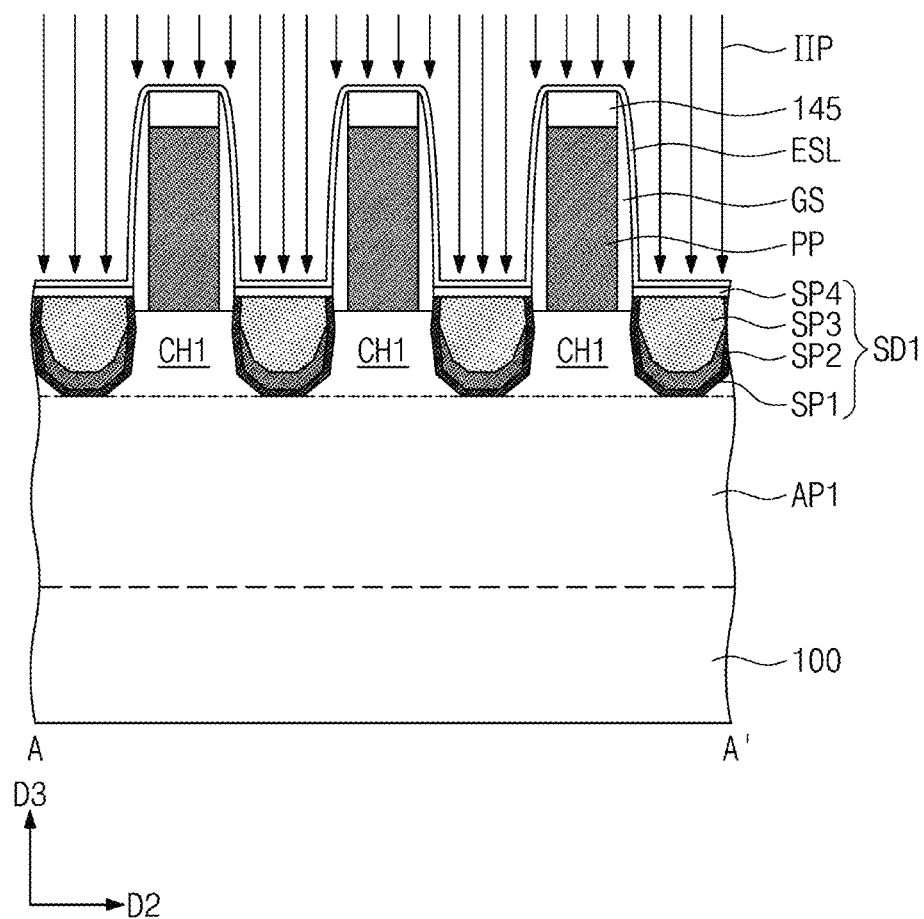
FIGS. 22A to 22D are cross-sectional views taken along lines A-A', B-B', C-C', and D-D', respectively, of FIG. 21.
Figure 22B:
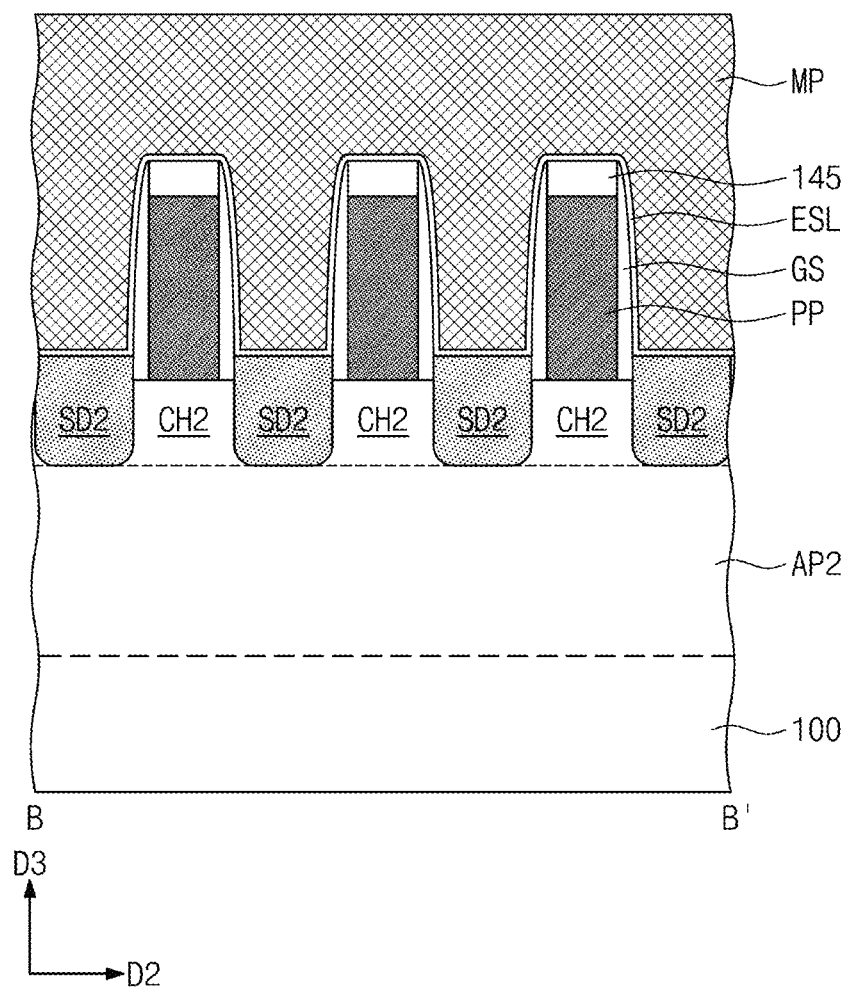
Figure 22C:
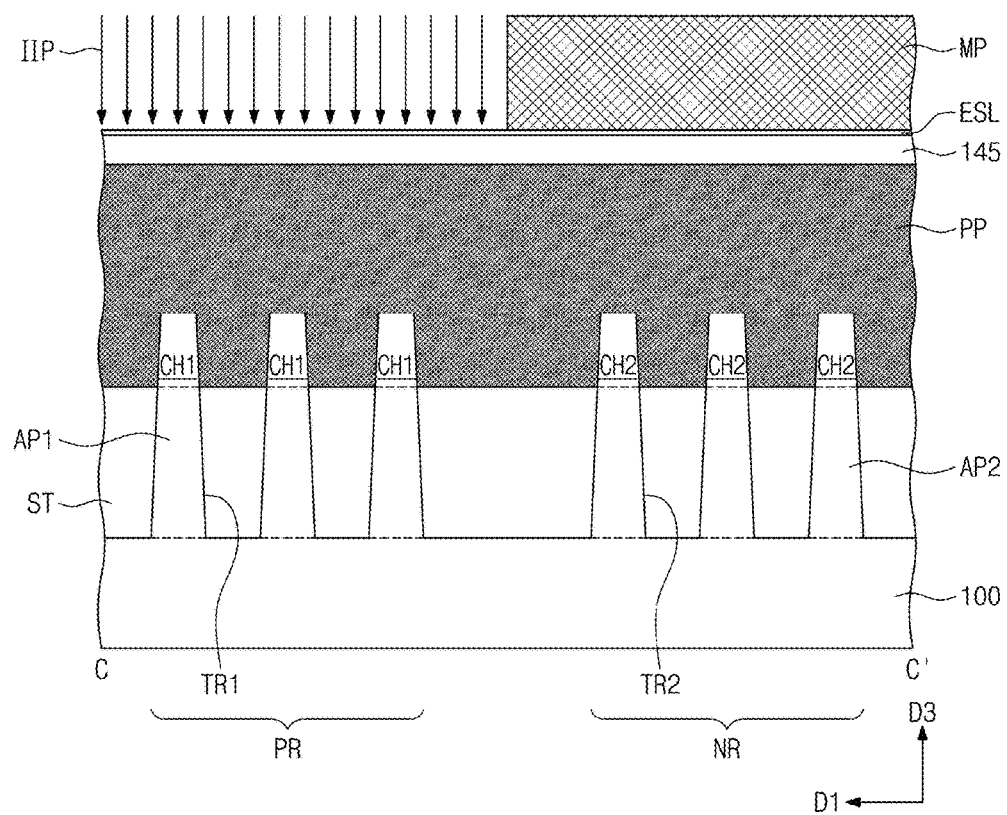
Figure 22D:
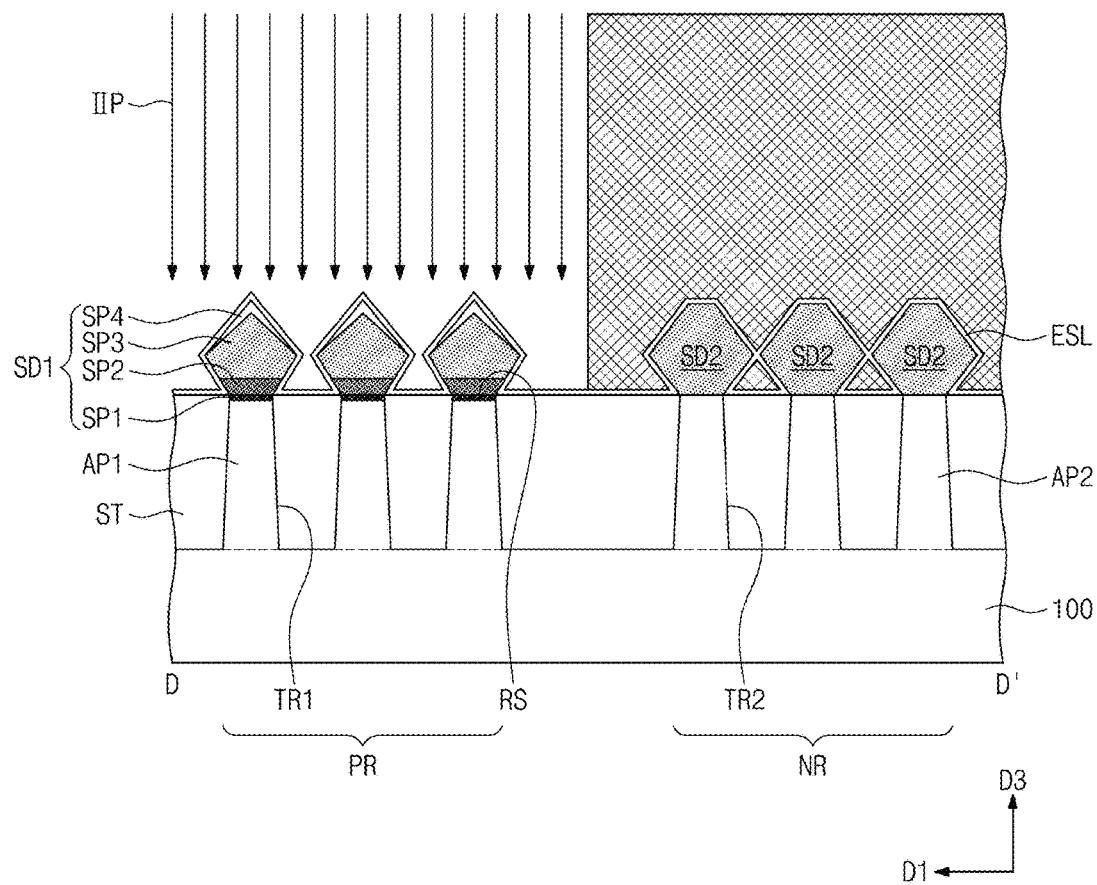

FIG. 21 is a plan view illustrating a method of fabricating a semiconductor device according to some embodiments of the present disclosure. FIGS. 22A to 22D are cross-sectional views taken along lines A-A', B-B', C-C', and D-D', respectively, of FIG. 21. For concise description, an element or step previously described with reference to FIGS. 4 to 20 may be identified by a similar or identical reference number without repeating an overlapping description thereof.

Referring to FIGS. 20, 21, and 22A to 22D, the mask pattern MP may be formed on the structure of FIG. 8 and FIGS. 9A to 9D to cover the NMOSFET region NR. The mask pattern MP may be formed to selectively expose the PMOSFET region PR. An ion implantation process IIP may be performed to dope the entire top surface of the substrate 100 with gallium (Ga) (in S100). As a result of the ion implantation process IIP, the third semiconductor patterns SP3 of the first source/drain regions SD1 may be doped with gallium (Ga). In this exemplary embodiment, the doping of gallium (Ga) into the first source/drain regions SD1 may be performed before the formation of the gate electrode GE.

Figure 23:
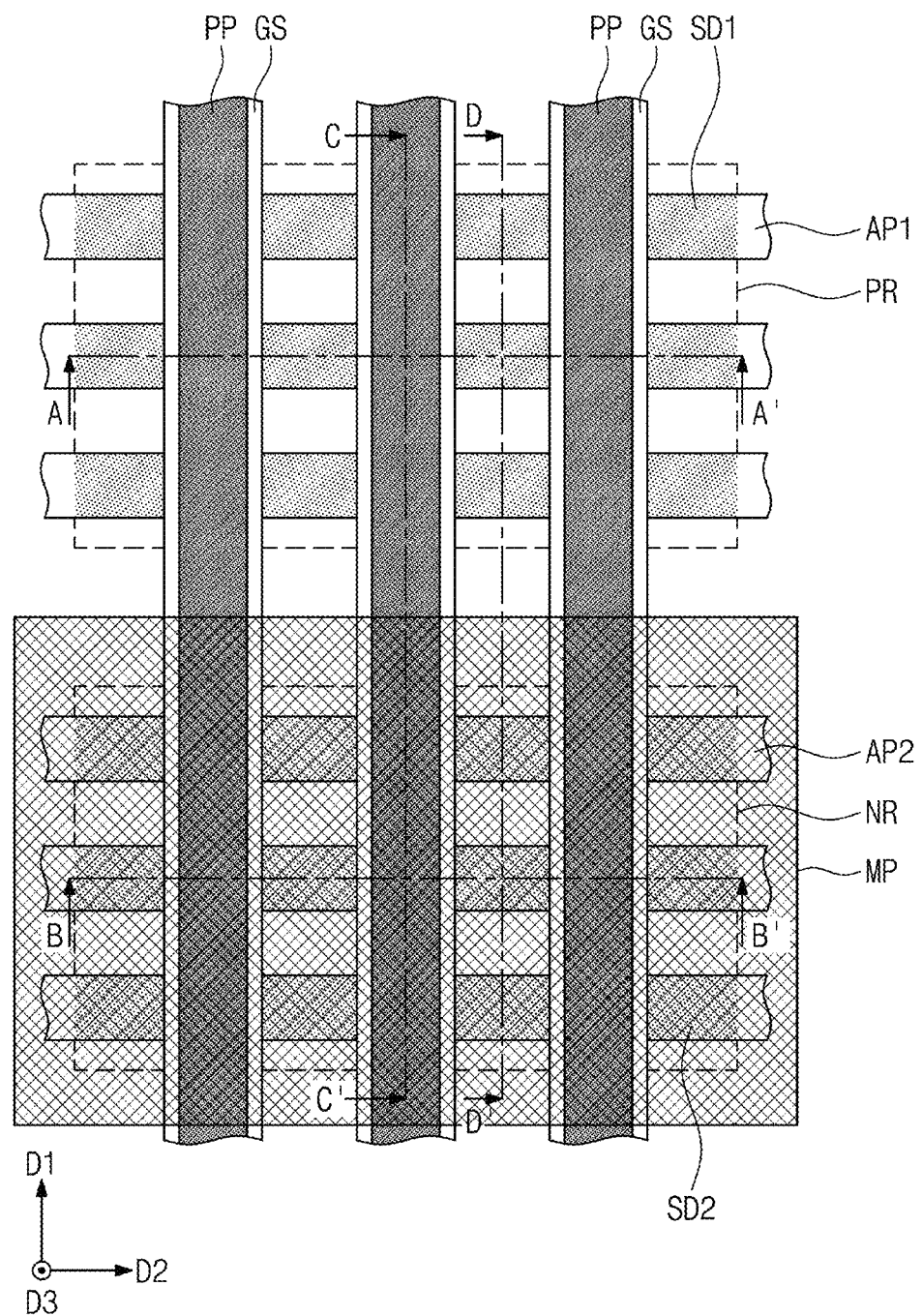
FIG. 23 is a plan view illustrating a method of fabricating a semiconductor device according to some embodiments of the present disclosure.
Figure 24A:
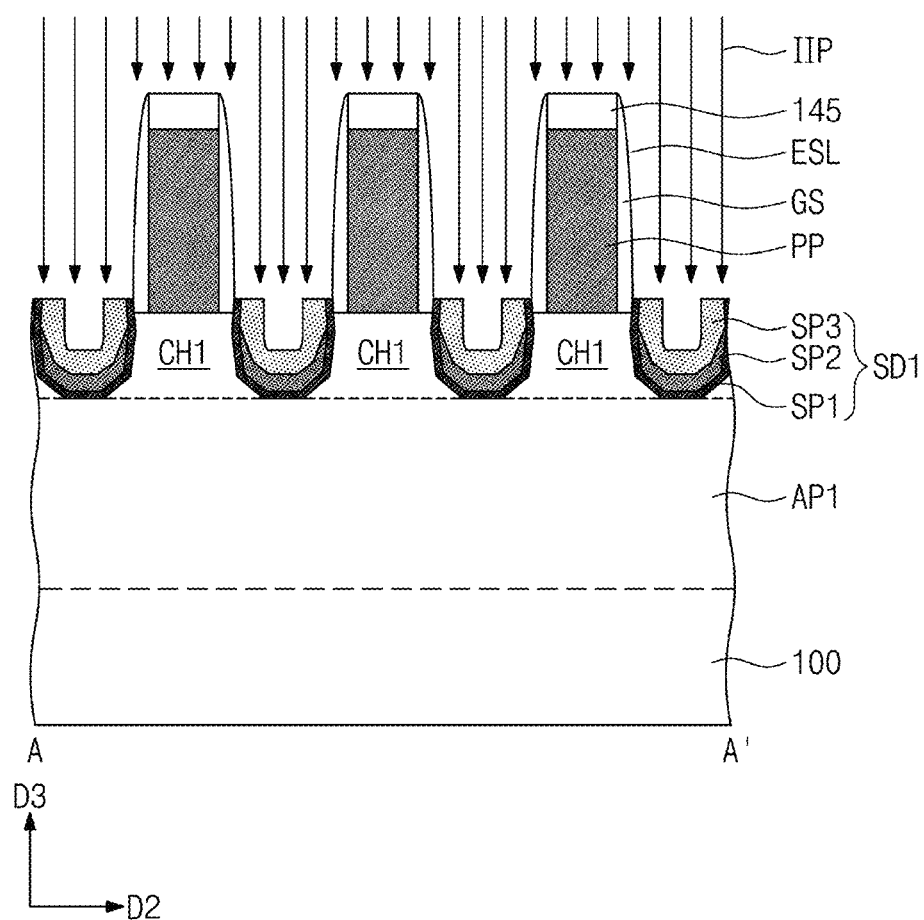
FIGS. 24A to 24D are cross-sectional views taken along lines A-A', B-B', C-C', and D-D', respectively, of FIG. 21.
Figure 24B:
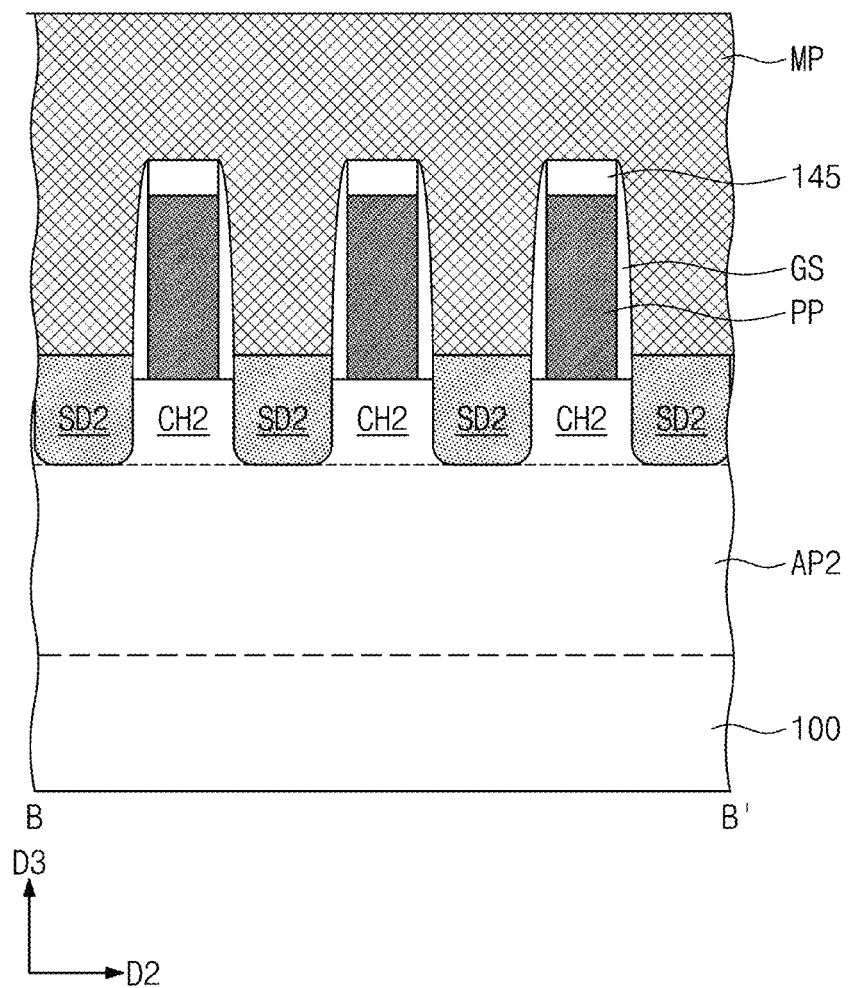
Figure 24C:
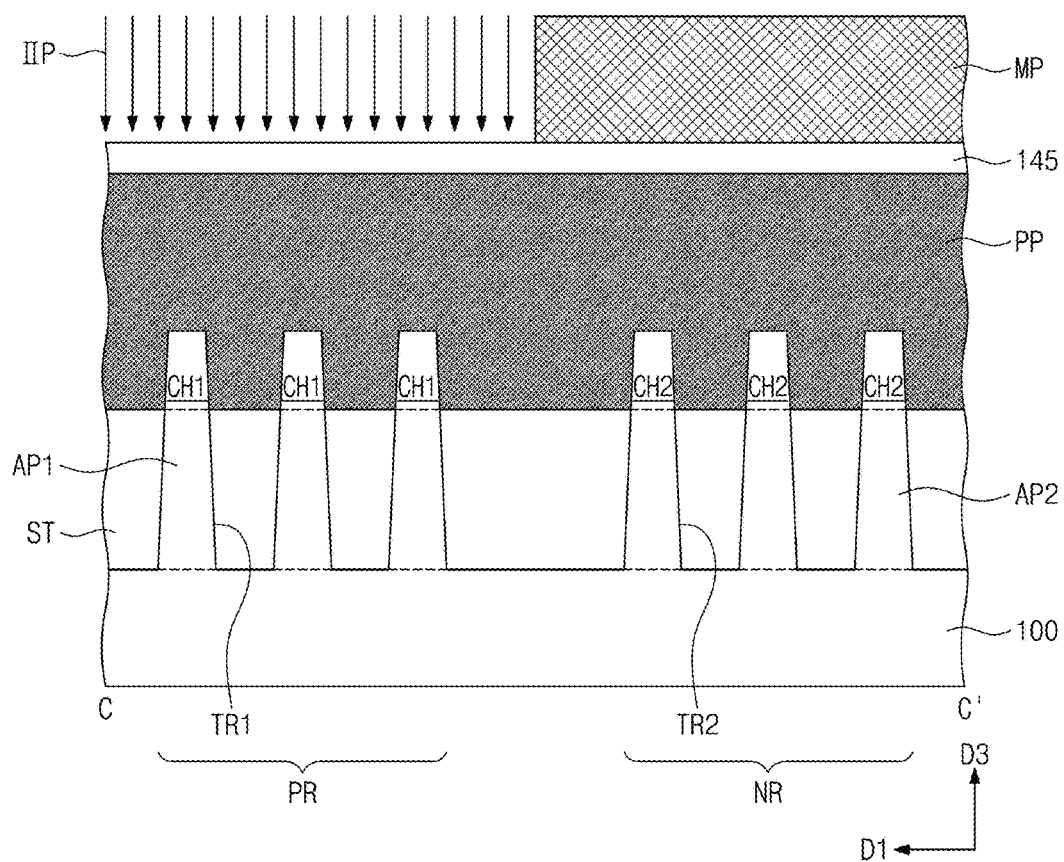
Figure 24D:
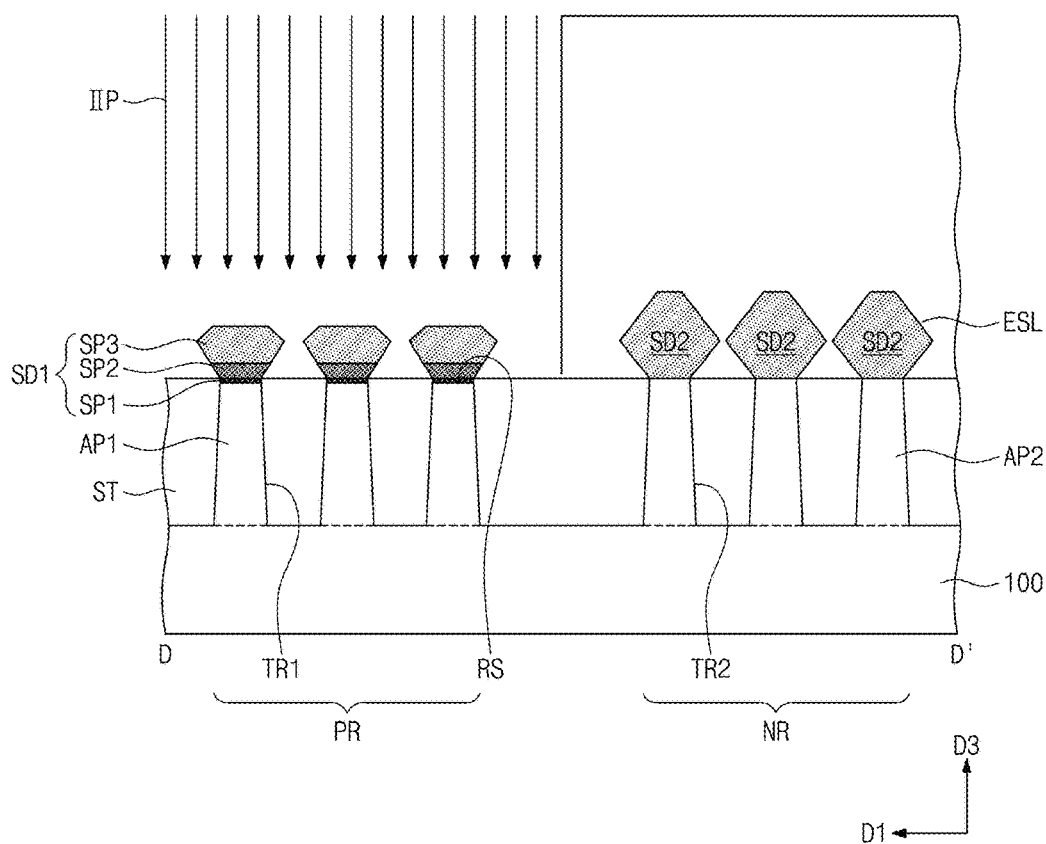

FIG. 23 is a plan view illustrating a method of fabricating a semiconductor device according to some embodiments of the present disclosure. FIGS. 24A to 24D are cross-sectional views taken along lines A-A', B-B', C-C', and D-D', respectively, of FIG. 21. For concise description, an element or step previously described with reference to FIGS. 4 to 20 may be identified by a similar or identical reference number without repeating an overlapping description thereof.

Referring to FIGS. 20, 23, and 24A to 24D, the second source/drain regions SD2 may be formed in upper portions of the second active patterns AP2, as previously described with reference to FIG. 8 and FIGS. 9A to 9D. The mask pattern MP may be formed to cover the NMOSFET region NR. The first source/drain regions SD1 may be formed on the PMOSFET region PR exposed by the mask pattern MP.

During the formation of the first source/drain regions SD1, an ion implantation process IIP may be performed in an in-situ manner (in S100). In some embodiments, the ion implantation process IIP may be performed to uniformly dope the third semiconductor pattern SP3 with gallium (Ga). According to this exemplary embodiment, the first source/drain regions SD1 may be in-situ doped with gallium (Ga) during its formation.

According to some embodiments of the present disclosure, a method of fabricating a semiconductor device is used to reduce electric resistance between a contact pattern and a source/drain region. Accordingly, it may be possible to improve a speed and electric characteristics of a semiconductor device.

While example embodiments of the present disclosure have been particularly shown and described, it will be understood by one of ordinary skill in the art that variations in form and detail may be made therein without departing from the spirit and scope of the attached claims.

What is claimed is:

1. A method of fabricating a semiconductor device, comprising:
   patterning an upper portion of a substrate to form a first active pattern, the substrate including a semiconductor element having a first lattice constant;
   performing a selective epitaxial growth process on an upper portion of the first active pattern to form a first source/drain region;
   doping the first source/drain region with gallium;
   performing an annealing process on the first source/drain region doped with gallium; and
   forming a first contact pattern coupled to the first source/drain region,
   wherein the first source/drain region includes a semiconductor element having a second lattice constant larger than the first lattice constant,
   wherein the forming of the first contact pattern comprises:
   forming an interlayered insulating layer on the substrate to cover the first source/drain region;
   forming a contact hole to penetrate the interlayered insulating layer and to expose the first source/drain region;
   forming a barrier layer in the contact hole; and
   forming a conductive layer in the contact hole, and
   wherein the forming of the first contact pattern further comprises forming a contact spacer layer to fill a portion of the contact hole, and
   the doping of the first source/drain region with gallium is performed on the contact spacer layer.

2. A method of fabricating a semiconductor device, comprising:
   forming a first device isolation layer on a PMOSFET region of a substrate to define a first active pattern, an upper portion of the first active pattern vertically protruding above the device isolation layer;
   forming a gate electrode to cross the first active pattern;
   performing a selective epitaxial growth process on the first active pattern adjacent to a side of the gate electrode to form a first source/drain region;
   doping the first source/drain region with gallium;
   performing an annealing process on the first source/drain region doped with gallium; and
   forming a first contact pattern coupled to the first source/drain region,
   wherein the first source/drain region has a maximum width, when measured in a direction parallel to a top surface of the substrate, at a first level, and
   a bottom surface of the first contact pattern is positioned at a level that is higher than the first level and is lower than a bottom surface of the gate electrode.

3. The method of claim 2, wherein the substrate includes silicon (Si), and the first source/drain region includes silicon-germanium (SiGe).

4. The method of claim 2, further comprising selectively etching the first active pattern adjacent to the side of the gate electrode to form a recess region,
   wherein the selective epitaxial growth process is performed using the recess region as a seed layer, and
   the first source/drain region is formed to fill the recess region.

5. The method of claim 2, wherein the doping of the first source/drain region with gallium is performed after the forming of the first source/drain region.

6. The method of claim 2, wherein the doping of the first source/drain region with gallium is performed in an in-situ manner during the forming of the first source/drain region.

7. The method of claim 2, further comprising forming a gate dielectric pattern between the first active pattern and the gate electrode,
- wherein the first contact pattern is formed to have a bottom surface lower than the gate dielectric pattern.

8. The method of claim 2, further comprising:
- forming a second device isolation layer on an NMOSFET region of the substrate to define a second active pattern, an upper portion of the second active pattern vertically protruding above the second device isolation layer;
- performing a selective epitaxial growth process on the second active pattern adjacent to a side of the gate electrode to form a second source/drain region; and
- forming a second contact pattern coupled to the second source/drain region,
- wherein the gallium is selectively doped in the first source/drain region, except for the second source/drain region.

* * * * *